(12) United States Patent
Ogawa et al.

(10) Patent No.: US 6,479,837 B1
(45) Date of Patent: Nov. 12, 2002

(54) THIN FILM TRANSISTOR AND LIQUID CRYSTAL DISPLAY UNIT

(75) Inventors: Kazufumi Ogawa, Nara (JP); Kazuyasu Adachi, Kobe (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/743,169

(22) PCT Filed: Jul. 5, 1999

(86) PCT No.: PCT/JP99/03644

§ 371 (c)(1),
(2), (4) Date: Jan. 5, 2001

(87) PCT Pub. No.: WO00/02251

PCT Pub. Date: Jan. 13, 2000

(30) Foreign Application Priority Data

| Jul. 6, 1998 | (JP) | H10-190060 |
|---|---|---|
| Feb. 4, 1999 | (JP) | H11-046226 |
| Feb. 24, 1999 | (JP) | H11-046227 |
| Feb. 24, 1999 | (JP) | H11-046228 |

(51) Int. Cl.[7] .......... H01L 29/04; H01L 31/20; H01L 31/036; H01L 31/0376
(52) U.S. Cl. .......... 257/59; 257/72; 257/64; 257/70
(58) Field of Search .......... 257/59, 64, 60, 257/70, 72, 75; 349/43, 46, 86, 113

(56) References Cited

U.S. PATENT DOCUMENTS

| 5,614,426 A | | 3/1997 | Funada et al. | |
|---|---|---|---|---|
| 5,643,826 A | * | 7/1997 | Ohtani et al. | 438/230 |
| 5,663,578 A | * | 9/1997 | Hsu et al. | 257/66 |
| 5,693,961 A | * | 12/1997 | Hamada | 257/66 |
| 5,763,904 A | * | 6/1998 | Nakajima et al. | 257/66 |
| 6,115,094 A | * | 9/2000 | Fukunaga | 257/72 |
| 6,335,541 B1 | * | 1/2001 | Ohtani et al. | 257/59 |
| 6,190,949 B1 | * | 2/2001 | Noguchi et al. | 438/149 |

FOREIGN PATENT DOCUMENTS

| EP | 0 810 639 A | 12/1997 |
|---|---|---|
| JP | 58-067068 | 4/1983 |
| JP | 63-194326 | 8/1988 |
| JP | 03-286537 | 12/1991 |
| JP | 05-136169 | 6/1993 |
| JP | 06-289431 | 10/1994 |
| JP | 08-008179 | 1/1996 |
| JP | 11-121753 | 4/1999 |

* cited by examiner

*Primary Examiner*—David Nelms
*Assistant Examiner*—Andy Huynh
(74) *Attorney, Agent, or Firm*—Parkhurst & Wendel, L.L.P.

(57) ABSTRACT

A bottom-gate type thin-film transistor free from alignment shift of the gate electrode and from damage caused by injection of impurities. The crystal grains of a polycrystalline silicon thin-film are anisotropically grown to form a prescribed angle relative to the gate length direction. The angle between the gate length direction and the longitudinal direction of the grains is adjusted according to use of the liquid crystal display unit. The bottom-gate transistor includes an undercoat insulating layer containing impurities on the substrate. Impurities are diffused from the undercoat layer to the semiconductor layer by laser-annealing the amorphous silicon.

32 Claims, 15 Drawing Sheets

(a)

(b)

(a)

(b)

THIN FILM TRANSISTOR AND LIQUID CRYSTAL DISPLAY UNIT

TECHNICAL FIELD

The present invention relates to a thin-film transistor (TFT) using polycrystalline silicon thin-film as an active layer serving as a source area or a drain area, and a liquid crystal display unit (LCD) using such TFT.

BACKGROUND ART

There is at present a demand for a liquid crystal display unit capable of displaying at a higher speed, and as one of the means for satisfying such a requirement, it has been tried to change an active layer such as a gate area, a source area, or a drain area of the switching thin-film transistor that controls the liquid crystal layer from the amorphous silicon thin film into the polycrystalline silicon. This is the result obtained by paying attention to the fact that the mobility of the carrier in polycrystalline silicone is higher than that in amorphous silicon in principle.

In addition to formation of a polycrystalline silicon thin film having a high carrier mobility on an insulating substrate, it has been tried, not to externally attach a semiconductor chip having a single-crystal silicon active layer to the driving circuit of the liquid crystal display section as in the conventional art, but to simultaneously form a thin-film transistor having an active layer comprising a polycrystalline silicon thin film in the frame of the pixel section on the same substrate from the beginning.

We will now briefly describe with by referring to the drawings the process of forming a thin-film transistor by polycrystallizing this amorphous silicon, after forming an amorphous silicon thin film on a transparent insulating substrate such as a glass substrate, and the manufacturing method of a liquid crystal display unit using a thin-film transistor having an active layer comprising this polycrystalline silicon thin film, since they are related with the intent of the present invention although they may fall under the known conventional art.

FIG. 1 illustrates the state of changes in the cross section of a conventional thin film transistor using a polycrystalline silicon thin film as an active layer according to the progress of manufacture. Actually, a large number of the thin-film semiconductor for the pixels and the driving circuits thereof are formed and arranged in many rows and stages, i.e. the upper, lower, right, and left on the substrate in accordance with the layout of the liquid crystal display section. However, since this is a well known fact, and moreover, it is troublesome to show this process in detail, only one thin-film semiconductor is shown in this FIG. 1.

In this FIG. 1, 1 represents an insulated substrate having transparency such as a glass, 2 represents a buffer layer for preventing an alkali metal or the like contained in the insulated substrate 1 from diffusing into an active layer comprising a silicon thin film and exerting an adverse Effect, 3 represents an amorphous silicon thin film; and 4 represents a polycrystalline silicon thin film. 5 represents a gate insulating film (layer) comprising, for example, $SiO_2$ and $Si_3N_4$ and 6 represents a gate electrode. 7 represents a channel area and 8 represents a source area. 9 represents a drain area, and 10 represents a contact hole. 11 represents a source electrode, and 12 represents drain electrode.

A manufacturing method of a thin-film transistor using a polycrystalline silicon thin film as an active layer of thin-film transistor will now be described sequentially by referring to FIG. 1.

(a) The amorphous silicon thin film 3 shall be formed by deposition on the insulated substrate via the buffer layer 2;

(b) Polycrystallizing treatment of silicon shall be performed by applying a heat treatment to the amorphous silicon thin film 3 to. More particularly describing, the polycrystalline silicon thin film is obtained by irradiating an excimer laser (beam) onto the amorphous silicon thin film 3, instantaneously melting the amorphous silicon, causing crystallization in accordance with cooling, and finally applying so-called laser annealing (or laser anneal technique). Then, unnecessary portions of the polycrystalline silicon thin film 4 on the substrate shall be removed, and the gate insulating film 5 and the gate electrode 6 shall sequentially be formed on the substrate.

In this state, impurities determining a type of conduction of the polycrystalline silicon thin film 4 such as phosphorus (P) or boron (B) are introduced from the upper section of the substrate into the polycrystalline silicon thin film 4 to form the source area and the drain area of the thin-film transistor, by using the gate electrode 6 as a mask, or simultaneously using a resist together if necessary, so as to prevent impurities from entering the channel area 7. This introduction is usually accomplished by injecting P or B ions accelerated with a high voltage. A case with P ions are illustrated in FIG. 1.

(c) The source area 8 and the drain area 9 are formed by activating the impurities through a heat treatment carried out by irradiating an excimer laser onto the polycrystalline silicon thin film 4 again.

(d) The source electrode 11 and the drain electrode 12 are formed by forming the contact hole 10, and by burying a metal inside it.

Next, the thin-film transistor shown in FIG. 1 is of so-called top-gate type in which a gate insulating layer is arranged on the substrate side of the gate electrode. As the applicable thin-film transistors for a liquid crystal unit include, apart from the top gate type, there is a type known as the bottom-gate type in which the gate insulating layer is arranged on the opposite side of the substrate against the gate electrode.

The bottom-gate type is advantageous in that it is capable to almost perfectly prevent impurities from diffusing from the undercoat such as the glass substrate to the channel area by means of the gate metal electrode. In this structure, however, because impurities forming the source area and the drain area cannot be diffused from the relatively thick substrate side, diffusion will be made from the silicon layer side after forming the silicon layer. As the result, it becomes difficult, or even impossible to perform self-alignment for forming the channel area, thereby causing deterioration of the transistor characteristics, such as a increased gate capacity.

On the other hand, a favorable feature of the top-gate type is that impurities forming the source area and the drain area is injected, from the gate electrode side after forming the silicon layer, by using the gate electrode as a mask, and thereby self-alignment will be permitted for forming the channel area. In this structure, however, since there is no gate metal under the channel area, diffusion of the impurities from the undercoat such as a glass substrate into the channel area during the subsequent heat treatment cannot completely be prevented, or is at least difficult to completely prevent such diffusion. If the thickness of the undercoat insulating film layer on the substrate is increased to avoid this defect, various problems such as cambering of the substrate will occur.

A conventional bottom-ate type thin-film transistor and a manufacturing method of it will now be described in detail by referring to the drawings.

FIG. 2 illustrates formation of the cross-section according to the progress of the manufacturing process of the conventional bottom-gate type thin-film transistor. In this FIG. 2, the numeral (latter we omit "the numeral") 1 represents a transparent insulated substrate Comprising a glass or the like. 5b represents a gate insulating layer comprising $SiO_2$ or the like, and 6b represents a gate electrode. 7b represents a channel area in the silicon semiconductor layer, and 8b represents a source area in the silicon semiconductor layer. 9b represents a drain area in the silicon semiconductor layer, and 30 represents photo-resist. 5c represents an interlayer insulating layer, 11b represents a source electrode, and 12b represents a drain electrode.

The manufacturing method thereof will be described as based on the FIG. 2.

(a) The gate electrode 6 shall be formed on the transparent insulated substrate 1, and then the gate insulating layer 5b shall be formed covering the upper section of it;

(b) The silicon semiconductor layer 4 (a necessary area only) shall selectively be formed on the gate insulating layer 5b. In this step, when using polycrystalline silicon, which is attracting the general attention at present, as a silicon semiconductor layer, this amorphous silicon layer shall be polycrystallized by annealing using an excimer laser through a laser anneal, with a laser anneal technique, for example, after an amorphous silicon layer is formed.

Subsequently, a photo-resist 30 is formed only on the upper section of the silicon semiconductor layer at a position which is to constitute an upper section of the gate electrode 6b, and then B and other impurities determining a type of conduction of silicon is injected from the upper section of the substrate onto the silicon semiconductor layer by using this photo-resist 30 as a mask. As the result, the channel area 7b in which impurities constituting the thin-film transistor are not existent, the source area 8b and the drain area 9b into which impurities are injected will be formed.

(c) By forming an interlayer insulating layer 5c on the entire surface of the substrate after removing the photo-resist, by opening the contact hole 10 at a position corresponding to the source area 8b and the drain area 9b in the interlayer insulating layer 5c, and by incorporating the metals such as Ti and Mo by sputtering or the like into this contact hole to form the source electrode 11s and the drain electrode 12b, manufacturing of the thin-film transistor will be finished.

PROBLEMS TO BE SOLVED BY THE INVENTION

However, the thin-film transistor manufactured through the steps shown in the preceding FIG. 1 cannot be made into a single silicon crystal at the present level of art. In order to realize the liquid crystal display on a large screen of over 12 inches to 20 inches, or a further larger screen of 30 inches, uniformity of the thin-film transistor elements and the functions are still insufficient, and in is turn, uniformity of the display on a liquid crystal display unit and the display functions are still also insufficient.

Next, the bottom-gate type thin-film transistor shown in FIG. 2 has the following problems.

First, because a silicon semiconductor layer to serve as a source area and a drain area is present on the upper side of the gate electrode, it is necessary to form a photo-resist as a mask at a position corresponding to the gate electrode which is readily formed, when injecting impurities into the silicon semiconductor layer, a positional alignment at this point will also be required. However, for the extra-compact and fine thin-film transistor for the liquid crystal display of higher-grade fineness in a conceivable future, it will be difficult to conduct such a positional alignment. To describe just for information, a thin-film transistor at present is going to have the gate width of 10 $\mu$m, the length of about 6 $\mu$m, and the transistor length of about 20 $\mu$m, and further downsizing is expected to be realized in the future.

Under these circumstances, the top-gate type thin-film transistors are becoming the mainstream.

Secondly, the technique of injection of the impurity ions accelerated with a high voltage is used as a means for introducing the impurities into the currently polycrystallized silicon semiconductor layer, irrespective of the top-gate type or the bottom-gate type. However, this technique will more or less cause a damage to the crystal lattices of the silicon semiconductor layer. Therefore, a heat treatment is applied for recovering such a damage. The temperature for such a heat treatment is, however, limited to up to about 600° C. at the maximum because of the heat resistance of the glass of the substrate. In its turn, it is difficult to completely recover the damages.

Further, because of the very thin undercoat layer and semiconductor layer, alkali metals diffuse from the glass substrate into the semiconductor particularly during this heat treatment. Consequently, this leads to deterioration of the performance of the semiconductor.

Under these circumstances, there has been a demand for the development of a thin-film transistor excellent in high pixel density as well as response, and further having a sufficient performance in terms of the response and quality uniformity for the liquid crystal display units having a large display screen in the conceivable future.

Whether the top gate type or the bottom gate type, there has been a demand for the development of a technique adopting an inexpensive glass substrate, and less susceptible to damages to the silicon layer or the like when injecting the impurities. The demand has been particularly strong for the bottom-gate type.

Also, in an extra-fine bottom-gate type thin-film transistor, there has been a demand for the development of a technique permitting the injection of impurities appropriately coping with the gate electrode.

In addition, there has been a demand for the achievement of an inexpensive liquid crystal display unit having a very high pixel density and a satisfactory response with a large display area by using such a thin-film transistor.

Further, by paying attention to the decrease in the melting point during annealing and the considerable electric field movement, a new semiconductor thin film was recently developed by adding carbon and/or germanium located adjacent to silicon in the periodic table (5% carbon at the maximum, or up to 30% germanium a the maximum) in place of pure silicon. However, because similar problems are encountered in this case as well, there has been a demand for solving such problems.

DISCLOSURE OF INVENTION

The present invention was developed for the purpose of solving the problems as described above.

For this purpose, the first group of aspects of the invention provides a thin-film transistor having a polycrystalline silicon thin film serving as an active area formed on an insulating substrate, in which crystal grains of the polycrystalline silicon thin film have anisotropically been grown at an array substrate end within a plane, and in a direction in parallel with, or at right angles to, the gate length direction of the thin-film transistor in parallel therewith, or at right angles thereto, and the longitudinal direction thereof is at a particular angle to the gate longitudinal direction of the thin-film transistor.

When the anisotropic growth direction of the crystal grains is in the gate length direction, some of barriers are eliminated upon movement of the carrier, thus improving the electric field effect and mobility.

At this point, from 0.5 to 2 grains of the polycrystalline silicon thin film are contained per micron (1 μm) of the gate length. As the result, it is possible to achieve an electric field effect as typically represented by mobility of at least 300 cm$^2$/Vs for all the thin-film transistors.

Also, uniform transistor properties are available by manufacturing the thin-film transistor so that the longitudinal direction of the grains is substantially in parallel with the length direction of the gate of the thin-film transistor.

At this point, 5 to 20 grains are contained per micron of the gate length. This is desirable in terms of the uniformity and a high mobility.

The longitudinal growth direction of grains forms an angle of 45° to the gate length direction of the thin-film transistor. This brings about a thin-film semiconductor showing a good balance between high-speed movement and uniform characteristics.

It is desirable that from 1 to 10 grains are contained per micron of the gate length.

From the point of view of operating efficiency, it is desirable to anneal the upper (lower) and left (right) driving circuit sections and pixel sections by a long and slender laser beam in a run of scanning, and this is adopted in the invention.

Further, the substrate or the laser beam, particularly the substrate, is moved in a direction substantially at right angles to the longitudinal direction, in which the intensity of the laser beam in the shorter side direction is stronger at least at the center portion.

Next, in a liquid crystal display unit, provision of the driving circuit of the pixel section on the same substrate leads to a lower cost as a whole. Particularly, use of the driving circuit on the data drive side permits achievement of a high-performance liquid crystal display unit excellent in driving characteristics.

Further, when a shift register is provided in the driving circuit section, a more compact liquid crystal display unit is available. Provision of a buffer circuit as required results in a further more excellent display unit. Use of the thin-film transistor as a liquid crystal switch for the pixel section permits achievement of a liquid crystal display unit giving a good contrast. Such a liquid crystal display unit is proposed in the present invention.

The second group of aspects of the invention provides a bottom-gate type thin-film transistor formed on the substrate having an undercoat insulating layer formed on the substrate, which contains impurities determining a type of the conduction of silicon, in which the impurities contained in the silicon layer in contact with the undercoat layer upon laser annealing of amorphous silicon are diffused to form the source area and the drain area.

Further, the presence of the undercoat insulating layer prevents impurities contained in the transparent insulating substrate from diffusing into the thin-film semiconductor. As such an undercoat layer, a BSG (boron silicate glass) layer or a PSG (phosphorus silicate glass) layer is used.

In the manufacturing method of the thin-film transistor using a polycrystalline silicon semiconductor for the polycrystallization of amorphous silicon through irradiation of an excimer laser beam, it is instantaneously exposed to a very high temperature. A high-melting-point metal is therefore used as a gate electrode material.

Further, the high-melting-point metals mainly comprising Cr, Mo, Ti and the like are used to facilitate formation of a gate side wall insulating layer through oxidation of the gate electrode. Moreover, since Ti or Cr is passivated in oxidation (oxidizable), the thickness of the oxide film is spontaneously controlled. This is extremely favorable in the case of an extra-fine element.

REFERENCE NUMERALS

Figure 1:
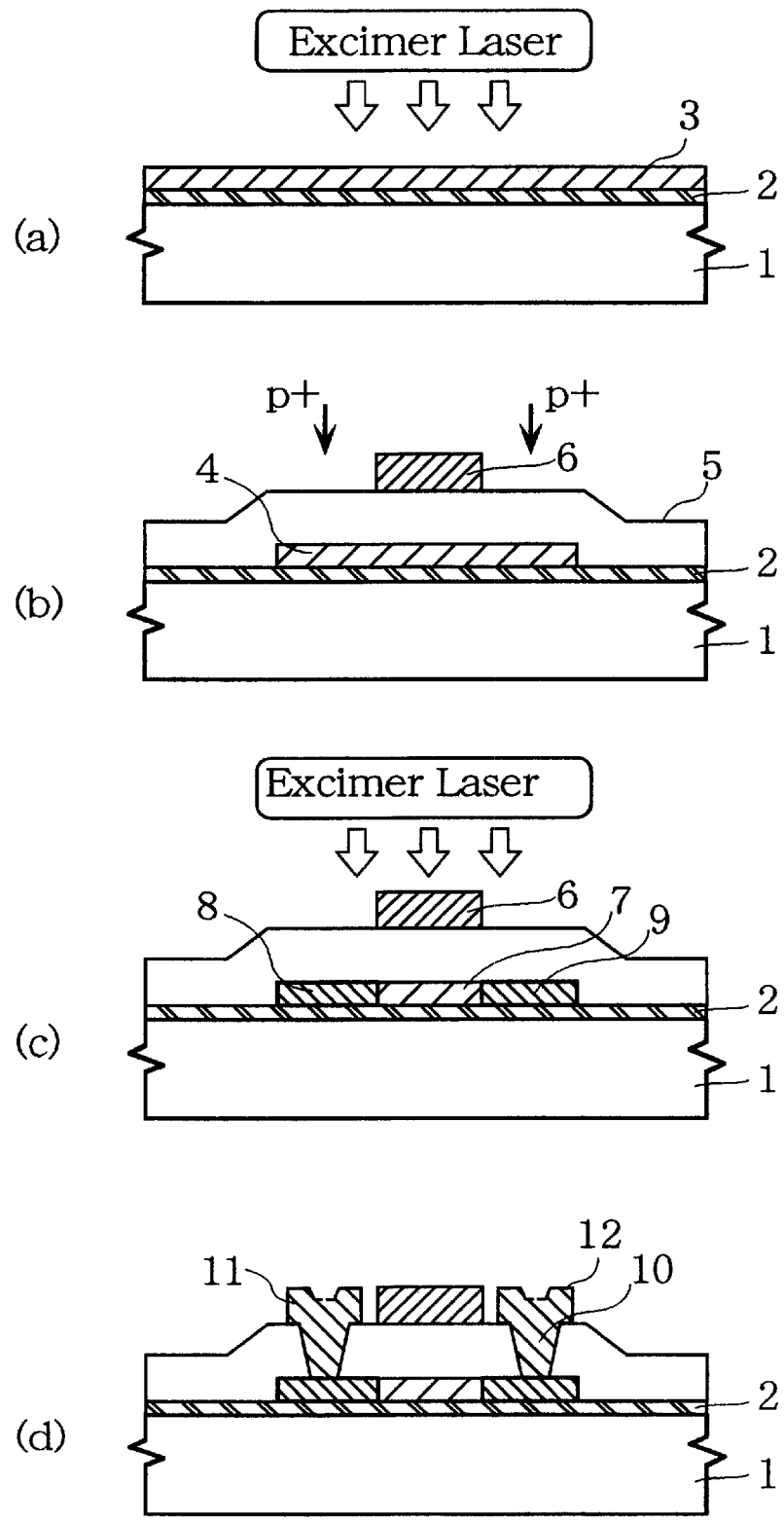
[FIG. 1] A conceptual view of a manufacturing method of a conventional thin-film transistor using polycrystalline silicon as an active layer of transistor.

1: Insulating substrate
2: Buffer layer (undercoat insulating film)
3: Amorphous silicon thin film (layer)
4: Polycrystalline silicon thin film
5: Gate insulating film
5b: Gate insulating film (bottom gate)
5c: Interlayer insulating film (bottom gate)
6: Gate electrode
6b: Gate electrode (bottom gate)
7: Channel area
7b: Channel area (bottom gate)
8: Source area
8b: Source area (bottom gate)
9: Drain area
9b: Drain area (bottom gate)
10: Contact hole
11: Source electrode
11b: Source electrode (bottom gate)
12: Drain electrode
12b: Drain electrode (bottom gate)
12: Pixel section
13: Gate driving circuit section
14: Source driving circuit section
15: Excimer laser beam
151: Excimer laser beam
152: Excimer laser beam
153: Excimer laser beam
16: Line showing the relative scanning direction of beam
161: Line showing the relative scanning direction of beam
162: Line showing the relative scanning direction of beam
163: Line showing the relative scanning direction of beam
20: Polysilicon thin film
21: Silicon crystal grain (long and slender polysilicon fine crystal grain)
22: PSG layer
23: BSG layer
24: Resist pattern
30: Photo-resist
31: Laser source
32: Quonset-hut type convex lens (so called barrel roof type or lenticule type)
33: Anti-Quonset-hut type concave lens
34: One-sided Quonset-hut type lens
35: Laser beam
41: First transparent electrode
42: Transistor
43: First array substrate
44: Color filter
45: Second electrode
46: Second color filter mounting substrate
47: Alignment layer (Orientational film)
48: Spacer
49: Adhesive
410: Liquid crystal
411, 412: Polarizer plate
413: Backlight
4p: First polysilicon layer into which impurities have been introduced
4b: Second polysilicon layer into which impurities have been introduced
61: Gate side wall insulating layer
6b: Gate electrode material layer

BEST MODE FOR CARRYING OUT THE INVENTION

The present invention will now be described by means of the embodiments.

(First Embodiment)

This embodiment relates to control of the grain growth direction upon polycrystallizing an amorphous silicon thin film through excimer laser annealing.

Figure 3:
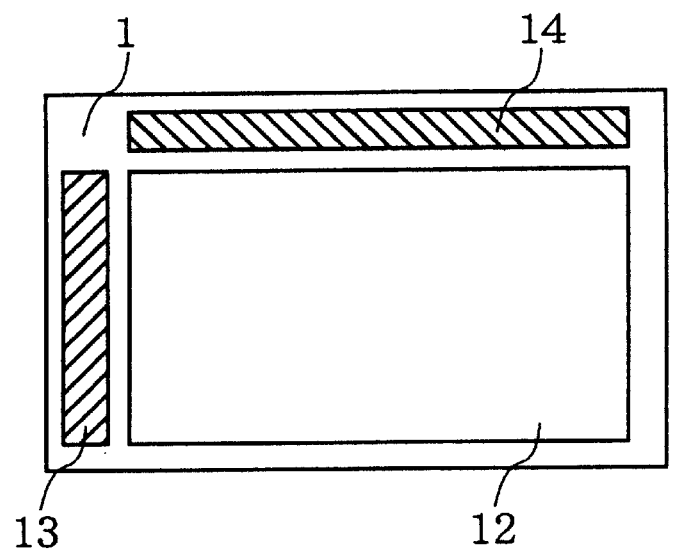
[FIG. 3] A conceptual view of a substrate plane in which a thin-film transistor of the pixel section and the driving circuit section on a peripheral frame thereof of a liquid crystal display unit are integrally formed, and the shape and the scanning direction of the laser beam on that plane in a first embodiment of the invention.
Figure 3:
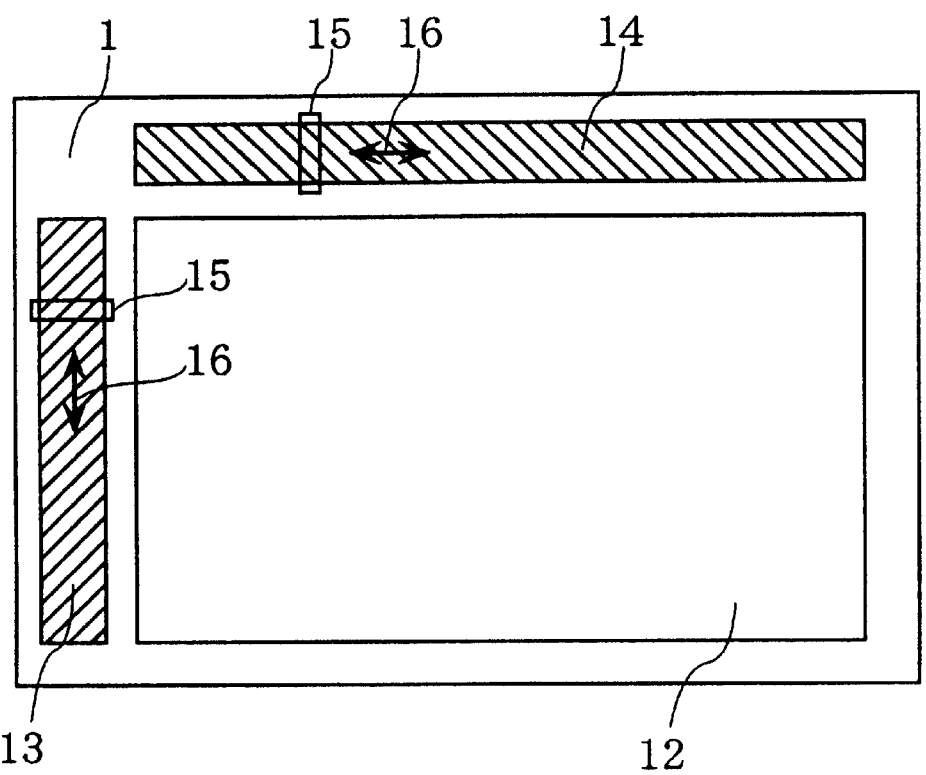

FIG. 3 is a plan view of a transparent insulating substrate formed in an arrangement known as one-sided mounting, comprising a thin-film transistor for pixel switching of the display section located at a position slightly shifting to the right downward from substantially the center of the liquid crystal display unit, and thin-film transistors for the driving circuit section of the pixel section in the upper and left frames in the substrate.

In FIG. 3(a), 1 represents a transparent insulating substrate made of glass or the like, and 12 represents a pixel section substantially at the center thereof, but slightly to the right downward. 13 represents a gate driving circuit (gate driver) section, and 14 represents a source driving circuit (source driver) section. In the pixel section and the driving circuit section, many thin-film transistors using polycrystalline silicon thin-films as active layers are arranged in a plurality of rows and stages.

The driving circuit of this embodiment contains a shift register for switching through synchronization with a dot timing signal and display of an image through A/D conversion.

Next, formation of the thin-film transistors of the pixel section, the gate driving circuit section and the source driving circuit section of this liquid crystal display unit will now be described.

First, the basic manufacturing method itself is the same as the conventional one described previously. A difference is in details of polycrystallization through heat treatment of the amorphous silicon thin film. The difference will be described in detail.

First, the excimer laser beam is a strip-shaped beam which has an energy density uniform in the longitudinal direction, and an intensity distribution in the short side direction. The principle for achieving this energy density distribution of the laser beam, which is a known art, but is directly associated with the intent of the invention, will be shown and briefly explained.

In FIG. 3, 31 represents a laser beam source. 32 represents a convex lens forming, not so-called Quonset-hut-shaped focal point, but a focal line (one-directional). 33 represents an anti-Quonset-hut type concave lens. 34 represents one-sided Quonset-hut-shape convex lens. And, 35, 35L, and 35R represents laser beams.

As shown in FIG. 3(a), a substantially linear laser beam is converted into a long and slender rectangular shape by the Quonset-hut type and anti-Quonset-hut type lenses along the direction of these lenses. The direction of this rectangle is in the same direction as that of the Quonset-hut type convex lens, i.e., it has a distribution of energy density by causing the beam to pass through the one-sided Quonset-hut type lens which is long and slender in the longitudinal direction of the beam. In FIG. 3(b), 35R represents this side of the long and slender rectangular laser beam as shown in FIG. 3(a), and 35L represents an opposite direction. The amorphous silicon layer 3 to be laser-annealed is present on this one-sided convex lens 34 side slightly from the focal line. As the result, the energy density distribution of this laser beam is as shown in FIG. 3(c).

Actually, however, a slit or a reflection plate having a special shape may be used. However, these steps are well known techniques used not only for lasers, but also for a usual optical system, and do not cover particularly difficult technical details. Therefore, further description is omitted here for techniques for obtaining the laser beam shape and the energy density distribution.

Figure 4:
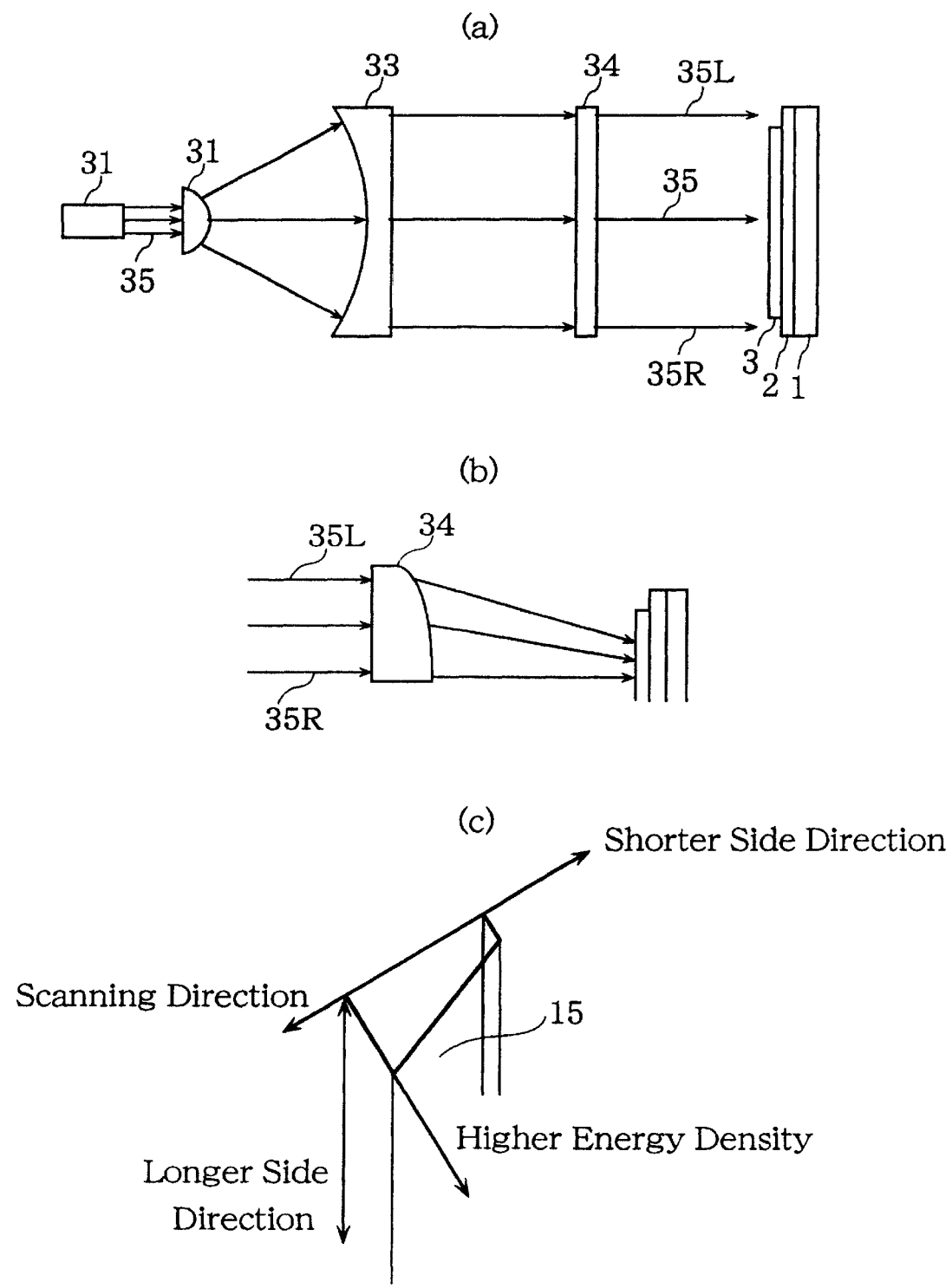
[FIG. 4] A conceptual view of the optical system of a laser irradiating unit, and the relationship between the beam scanning direction and the energy density in the above-mentioned embodiment of the invention.

Next, in beam scanning, polycrystallization is carried out by sequentially heating by irradiation the amorphous silicon thin film through relative movement to the substrate at a prescribed speed in a direction at right angles to the longitudinal direction while irradiating the beam, as shown in FIG. 3(b) and FIG. 4(c). In this step, the substrate should preferably be moved, in consideration of the laser source and the optical unit.

Next, regarding formation of the amorphous silicon layer, it is formed into a thickness of about 100 nm by previously forming an $SiO_2$ layer serving as an insulating undercoat on the surface of the glass substrate, and forming the amorphous silicon layer by the plasma CVD method on this $SiO_2$ layer.

Then, as shown in FIG. 3(b), setting is made so that the gate length direction of the thin film transistor to be formed and the moving direction of the substrate are substantially in parallel (in FIG. 3(b), these directions are set so that the array substrate end and the beam longitudinal direction form substantially right angles), and the beam is moved while irradiating the beam in a direction substantially at right angles to the laser beam longitudinal direction and in a direction in which the shorter side direction intensity of the laser beam is stronger.

For the reasons as described above, when moving the beam, the substrate is moved provided on the moving unit relative to the laser beam source fixed in the irradiating unit, hence the laser beam, thereby continuously crystallizing the amorphous silicon thin film (step-and-repeat method).

Figure 15:
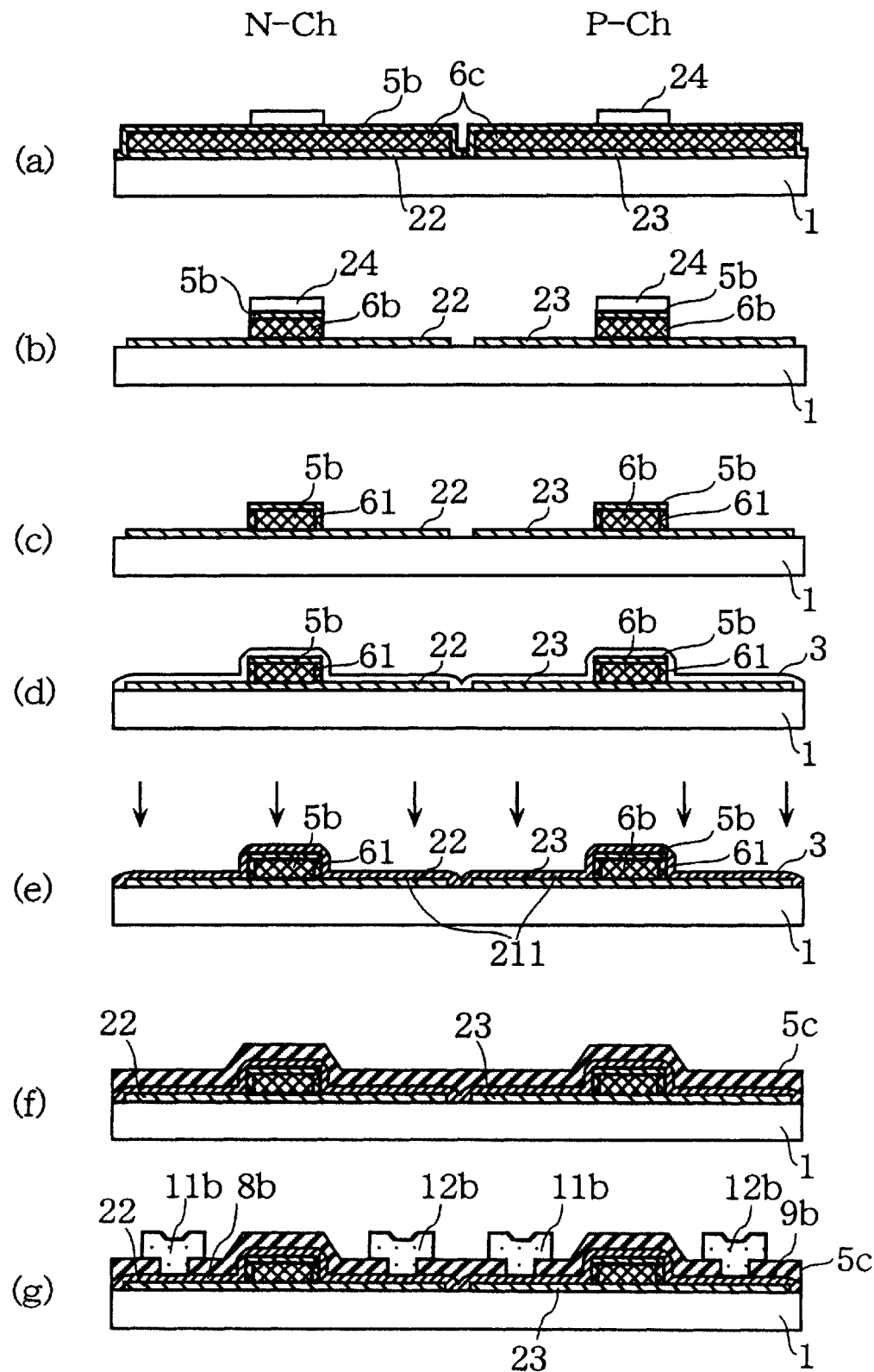
[FIG. 15] A conceptual view of the process of manufacture of the thin-film transistor in the sixth embodiment.

In FIG. 3(b), 15 represents the beam shape of the excimer laser, and the line 16 indicated by arrows at the both ends represents the relative scanning directions of the beam. The both ends are shown by the arrows here, because, depending upon the laser source output, or the beam size, it is necessary to reciprocate through the driving circuit section a plurality of times, and irradiation may be made for splashing dust deposited onto the amorphous silicon surface with laser irradiation of a low energy density, as a preliminary stage of laser annealing.

As the result, the crystal grains of the polycrystallized silicon thin film (also called domain or grain), which form a circular shape in the conventional art, do not form a circle in this embodiment, but form an ellipsoid long in the scanning direction.

The reason is as follows. Since the molten silicon is uniform and has the same temperature along the longitudinal direction, it is difficult for heat to escape in the longitudinal direction except for the ends. Particularly when laser annealing is applied prior to patterning, molten silicon form a long strand in the beam longitudinal direction. Heat does not therefore practically escape in this direction. However, in the shorter side direction which is the moving direction of the beam, the energy distribution has a higher density toward the center. The temperature therefore becomes lower in a direction counter to the advancing direction of the beam. Upon solidification of silicon, therefore, silicon is considered to be cooled from the beam anti-advancing direction end toward the running direction end.

Next, irradiating conditions will be described.

For example, when irradiation is conducted by using KrF (this may be XeCl) excimer laser under conditions including a thickness of the precursor amorphous silicon (a-Si) of 100 nm, a substrate temperature of 500° C., and a laser irradiating energy of 330 $mJ/cm^2$. Optical microscopic confirmation after a set scanning movement at a pitch of 1 micron/ shot suggests that there is available a thin film formed by silicon fine crystal grains having a longitudinal direction in the scanning direction, a longitudinal grain size within a range of from 3 to 5 microns and a shorter side grain size within a range of from 0.5 to 2 microns.

A higher substrate temperature is preferable, but when using glass, the temperature of the substrate itself should be within a range of from 300° C. to 600° C. considering the heat resistance of the material, and the most desirable polycrystalline silicon can be obtained under conditions including a film thickness within a range of from 30 to 200 nm, a laser irradiating energy within a range of 280 to 420 $mJ/cm^2$, and a laser irradiating power distribution within a range of about 3 to 10 $mW/cm^2$ per 10 microns.

Then, using the polycrystalline silicon thin film thus formed, a thin-film transistor can be formed through the same steps as those shown in FIG. 1. As a result, a polycrystaline silicon thin-film transistor, in which grains have anisotropically grown as shown in FIG. 5, is obtained.

Figure 5:
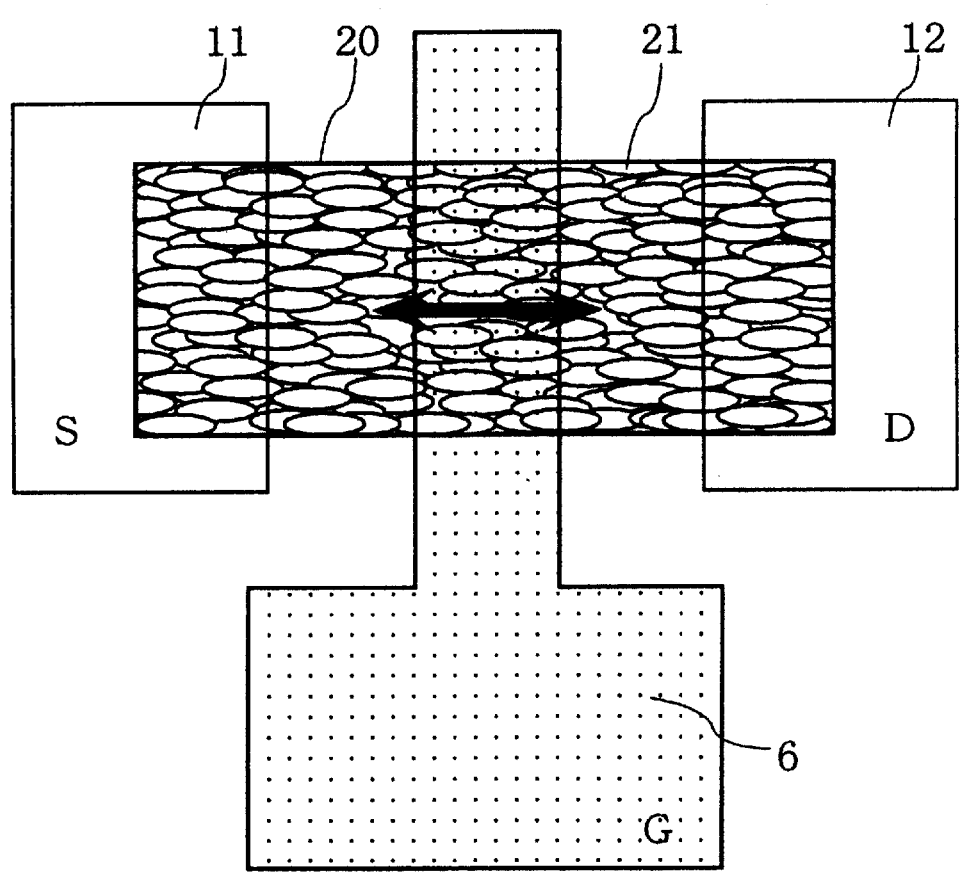
[FIG. 5] A conceptual plan view of the relationship between the gate length direction and the grain growth direction of the thin-film transistor in the aforementioned embodiment of the invention.

In FIG. 5, 11 represents a source electrode, 12 represents a drain electrode, 6 represents a gate electrode, and 20 represents a crystallized polysilicon thin film. And, the small ellipsoid 21 in FIG. 5 represents a silicon crystal grain anisotropically grown, and the arrows at both ends shown by thick black lines indicates a gate length direction.

The thin-film transistor of this embodiment, comprising silicon crystal grains having grown long in the gate length direction, permits minimization of the grain boundaries of the grains present in the channel area of the thin-film transistor. Barriers to the movement of the carrier when operating the thin-film transistor are therefore reduced (microscopically, approaching a single crystal), and there is available a thin-film transistor group having a high electric field effect mobility (specifically, about 480 $cm^2/Vs$). The resultant TFT is excellent for a liquid crystal display unit of a television set or an animation display unit.

(Case of Application of the First Embodiment)

This case of application relates to a liquid crystal display unit using the thin-film transistor of the first embodiment of the invention.

Figure 6:
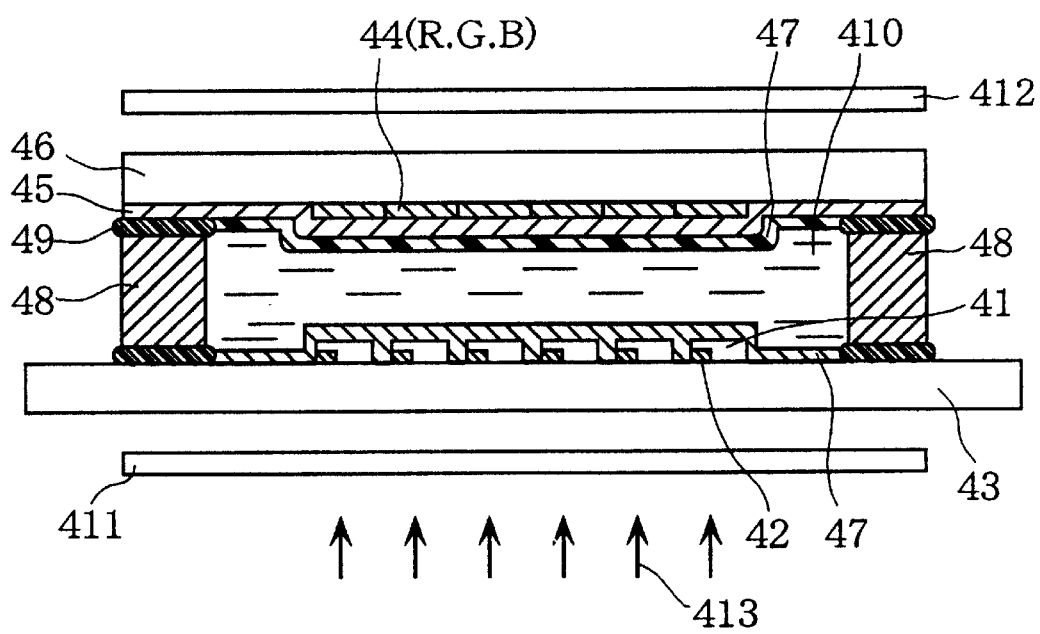
[FIG. 6] A conceptual view of the cross-section of a liquid crystal display unit using the thin-film transistor of the aforementioned embodiment.

FIG. 6 shows the liquid crystal display unit of this case of application. In the manufacturing method of this liquid crystal display unit, a liquid crystal layer is held between a first array substrate 43 having the first electrode 41 placed in a matrix shape and the transistor group 42 prepared in this embodiment, for driving this electrode group, and the second color filter unit substrate 46 having the R, G, and B color filters 44 placed opposite to the first electrode and the second electrode 45. In this step, the alignment films 47 and 47 having an alignment effect on the liquid crystal are previously formed directly on the inner surfaces of the both substrates (the sides of the liquid crystal layers) or on the surface of a thin-film formed for any other purpose.

Also, the first and second color filter substrates 43 and 46 are previously aligned so that the electrodes face each other, and secured with a gap of about 5 microns by means of the spacer 48 and the adhesive 49.

Then, a liquid crystal layer 410 is formed by injecting by the vacuum method TN liquid crystal (ZL14792: made by Merk Co.) between the first and second substrates 43 and 46, and then, polarizer plates 411 and 412 are combined to complete a liquid crystal display element.

An image is displayed in the arrow A direction by driving the individual transistors by use of the video signals while irradiating the backlight 413 shown by an arrow over the entire surface in this liquid crystal display unit.

Meantime, as to the performance of this liquid crystal display unit, comparison of delays is signal processing even by enlarging the liquid crystal screen as a whole from 3.8 type to 13 type, suggests that it is possible to minimize the delay, and the possibility of performing a high-speed display has been confirmed.

(Second Embodiment)

This embodiment as well relates to control of the growing direction of the silicon grains upon polycrystallizing silicon through excimer laser annealing. However, the growth direction is different when compared with that of the above-mentioned first embodiment.

The liquid crystal display unit of this embodiment as shown in FIG. 7(a) has the same substrate as that shown in FIG. 3(a), and consequently the same reference numerals are assigned to the corresponding component parts.

Furthermore, the thin-film transistors of the gate driving circuit section 13 and the source driving circuit section 14 are both the thin-film transistors for driver circuit, and contain shift registers as in the above embodiment.

Further, the manufacturing method of the polycrystalline thin-film semiconductor of this embodiment comprises the steps of previously forming an $SiO_2$ layer on the surface of a glass substrate, forming an amorphous silicon layer into a thickness of about 100 nm by the plasma CVD method via the $SiO_2$ layer, rectifying an excimer laser beam into a strip shape having an energy uniform in the longer side direction and an intensity distribution in the shorter side direction, and moving the layer in a direction substantially at right angles to the longer side direction thereof while irradiating the beam to irradiate and heat the amorphous silicon thin film, thereby conducting polycrystallization: the basic steps are the same as in the conventional art and in the first embodiment described above.

Next, this is followed by the steps of setting the directions so that the gate length direction of the TFT to be formed is substantially in parallel with the moving direction of the substrate, and moving the substrate in a direction substantially at right angles to the longer side direction of the laser beam which is a direction in which the intensity of the laser beam in the shorter side direction is stronger, irradiating the excimer laser beam each time the substrate is moved relative to the excimer laser, thereby continuously crystallizing the amorphous silicon thin film, as in the first embodiment mentioned above.

However, growth anisotropy of the grains upon polycrystallizing the formed amorphous silicon thin film by heat treatment is different. The difference will therefore be described here.

Figure 7:
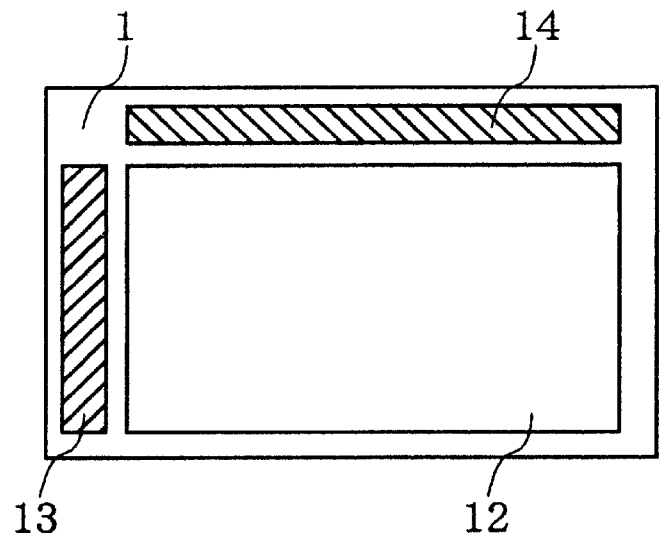
[FIG. 7] A conceptual view of the substrate plane on which the thin-film transistor of the driving section of a liquid crystal display unit is formed, and the shape and scanning direction of the laser beam on that plane in a second embodiment of the invention.
Figure 7:
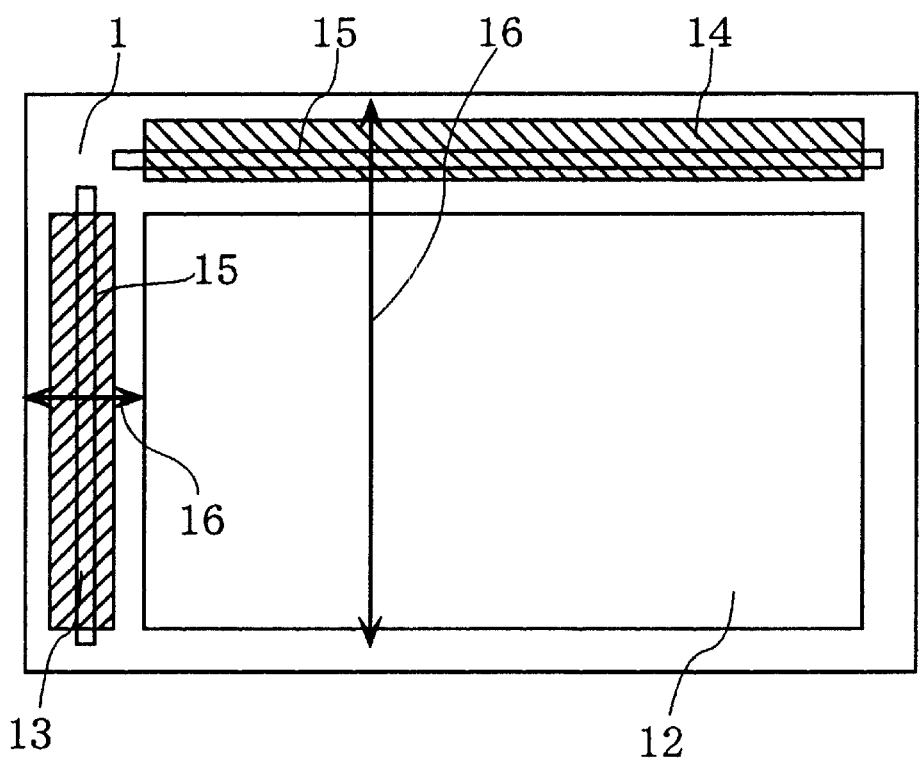

The scanning direction of the excimer laser beam in this embodiment is shown in FIG. 7(b). In FIG. 7(b) as well, 15 represents the shape of the excimer laser beam, and the line 16 having arrows at the both ends represents the scanning direction of the excimer laser relative to the substrate or the pixel, or bearings. As is clear from FIG. 7, first of all in this embodiment, scanning is conducted in a direction perpendicular to that in the above-mentioned embodiment. Secondly, the source driving circuit section 14 and the pixel section are simultaneously laser-annealed with a laser beam in the same scanning direction.

Meantime, because the heating treatment is applied by using an excimer laser having an intensity distribution in the shorter side direction, the crystal grain of the polycrystallized silicon thin film does not take a circular shape, but has a longer side direction and a shorter side direction, and takes the shape of an ellipsoid long and slender in the scanning direction. Unlike in the above-mentioned first embodiment, however, the growth direction of silicon grains is at right angles to the gate length direction. This is illustrated in FIG. 8.

Figure 8:
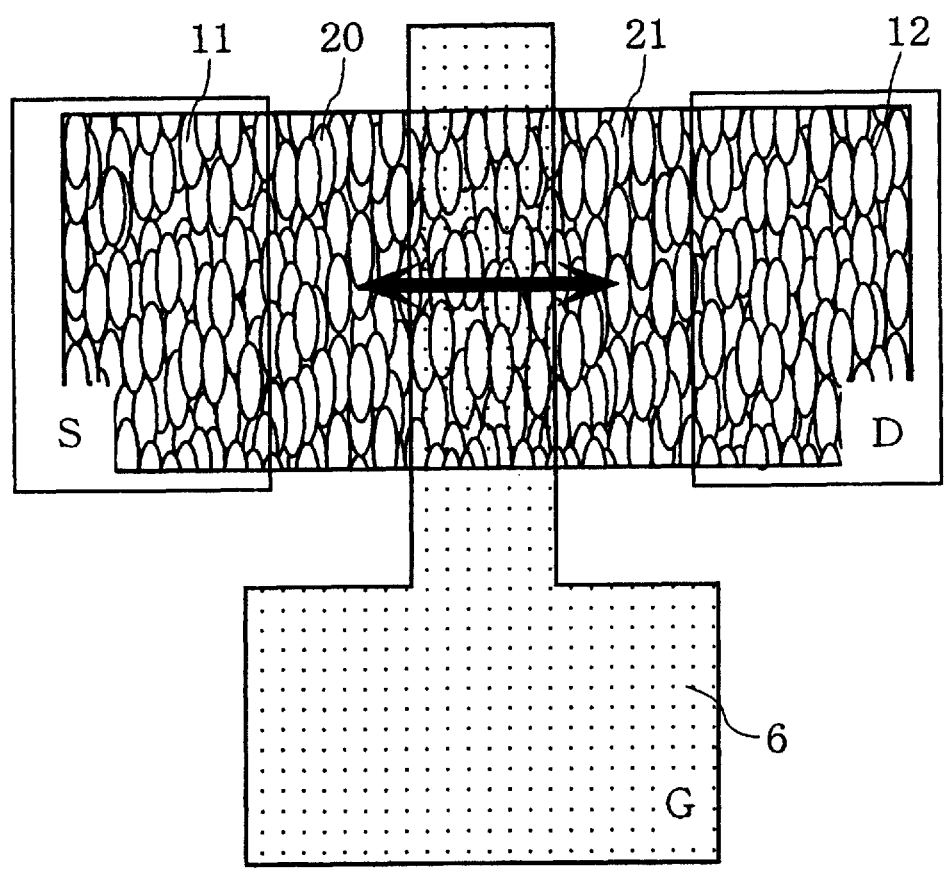
[FIG. 8] A conceptual plan view of the relationship between the gate length direction of the thin-film transistor and the growth direction of the crystal grains in the aforementioned embodiment.

In FIG. 8, 6 represents a gate electrode, 11 represents a source electrode, and 12 represents a drain electrode. And, 20 represents a crystallized polysilicon thin film, and the small ellipsoid is an anisotropically grown silicon crystal grain 20.

Next, also in this embodiment, irradiation conditions include, for example, KrF (this may be XeCl) excimer laser; a thickness of the precursor amorphous silicon (a-Si) of 100 nm, a substrate temperature of 500° C., a laser irradiation energy of 330 mJ/cm$^2$, and a scanning movement pitch of 1 micron/shot. After irradiation, confirmation is made through an optical microscope, and there is available a thin film comprising silicon fine grains having a longer side direction in the scanning direction and having a grain size within a range of from 3 to 5 microns in the longer side direction, and a grain size within a range of from 0.5 to 2 microns in the shorter side direction.

The optimum conditions at this point include, as in the first embodiment, the highest possible temperature, or a substrate temperature within a range of from 300 to 600° C. when glass is used, a film thickness within a range of from 30 to 200 nm, a laser irradiation energy within a range of from 280 to 420 mJ/cm$^2$, and a laser beam irradiation power in the shorter side direction within a range of from about 3 to 10 mW/cm$^2$ per 10 microns.

Then, a polycrystalline silicon thin-film transistor as shown in FIG. 1 was manufactured, as in the first embodiment described above by using the thus formed polycrystalline silicon thin film.

In this thin-film transistor, as shown in FIG. 8, the gate length direction of the thin-film transistor is substantially at right angles to the longitudinal direction of the polycrystalline silicon crystal grains grown and formed in a long and slender shape. As the result, it is possible to minimize the grain boundaries present in the channel area of the thin-film transistor.

It is therefore possible to provide an LCD excellent in display uniformity, in which barriers for carrier movement are made uniform upon operating the thin-film transistor. This results in a TFT excellent for a liquid crystal display unit exclusively used for displaying in a word processor, displaying a static image, a guiding sign in an electric car or a similar image.

Then, a liquid crystal display unit for a word processor using the thin-film transistor of this embodiment was manufactured. The resultant unit was really excellent. However, because this liquid crystal display unit has the same configuration as that shown in FIG. 6, illustration with drawings is subsequently omitted.

(Third Embodiment)

This embodiment as well relates to control of growth orientation of the grains upon polycrystallizing through excimer laser annealing. As compared with the two preceding embodiments, however, a difference is that the direction thereof forms an angle toward the gate length direction by 45°. The thin-film transistor of this embodiment will be described with reference to the drawings.

Figure 9:
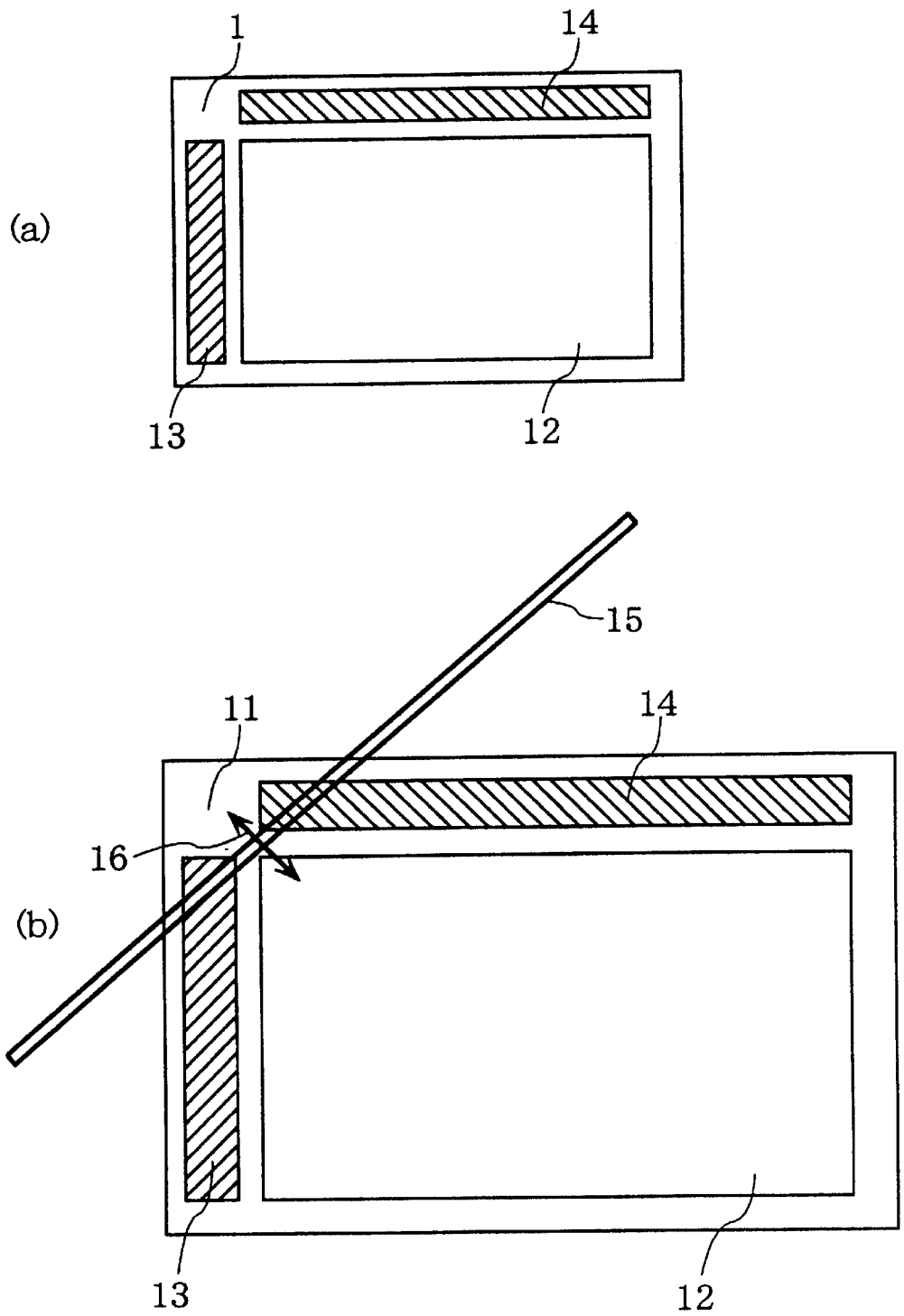
[FIG. 9] A conceptual view of the substrate plane on which the thin-film transistor of the driving section of a liquid crystal display unit is formed, and the shape and scanning direction of the laser beam on that plane in a third embodiment of the invention.

The substrate for the liquid crystal display unit of this embodiment, as shown in FIG. 9(a), is the same as those in the two preceding embodiments as shown in FIGS. 3(a) and 7(a).

Further, in this embodiment as well, the basic manufacturing steps and the features, or more specifically, rectifying the strip-shaped laser beam having uniform energy in the longer side direction and an intensity distribution in the shorter side direction, subjecting the amorphous silicon thin-film to irradiation and heating while irradiating this laser beam and while moving it in a direction substantially at right angles to the longer side direction, thereby performing polycrystallization while keeping anisotropy of growth of the liquid crystal grains, irradiating conditions, and crystal shape and size are the same as in the two preceding embodiments. A difference lies, however, in the grain orientation upon polycrystallizing the previously formed amorphous silicon thin film.

More particularly, as shown in FIG. 9(b), setting is made so that the side of the array substrate and the beam longer side direction form an angle of 45°, i.e., the gate longer side direction of the thin-film transistor to be formed and the substrate moving direction form substantially 45°, and the substrate or the laser beam is moved while irradiating the laser beam in a direction substantially at right angles to the longitudinal direction of the laser beam, in which intensity of laser beam in the shorter side direction becomes the strongest.

Also in FIG. 9(b), 15 represents the shape of the excimer laser beam, and the line 16 having arrows at both ends represents the scanning direction of the beam relative to the substrate.

Figure 10:
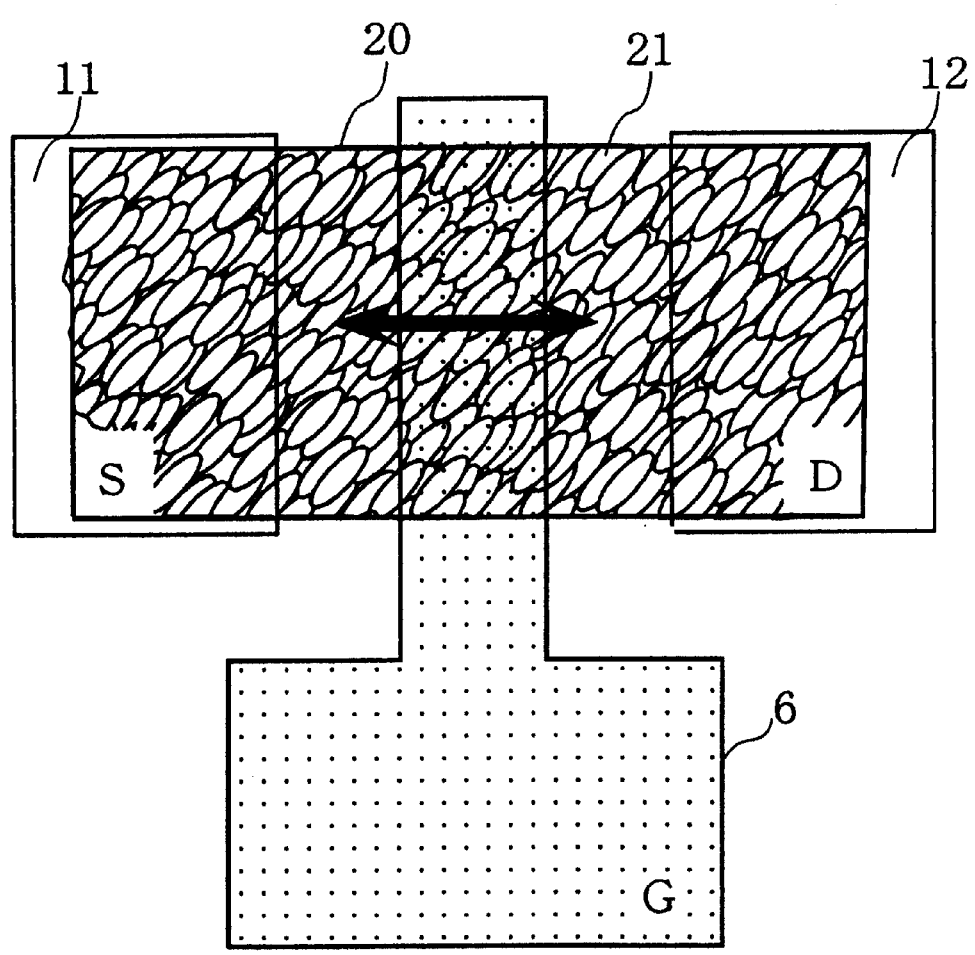
[FIG. 10] A conceptual plan view of the relationship between the gate length direction of the thin-film transistor and the growth direction of crystal grains in the aforementioned embodiment.

As the result, in this embodiment as well, the crystal grain polycrystallized forms an elliptical shape long in the scanning direction. The longitudinal direction of the grain itself inclines by 45° toward the gate length direction as shown in FIG. 10.

Then, a TFT will be formed by using the polycrystalized silicon thin film formed as in the same manner as described above in the two preceding embodiments.

Since, in the thin-film transistor of this embodiment, the gate length direction of the thin-film transistor forms an angle of approximately 45° to the longitudinal direction of the crystal grains of polycrystalline silicon grown and formed into a thin and slender shape, a high electric field effect mobility is available while reducing the grain boundary dispersion of the grains present in the channel area of the thin-film transistor.

Next, a liquid crystal display unit for word processor using the thin-film transistor of this embodiment was manufactured, and a very excellent one was obtained. The configuration of this liquid crystal display unit, being the same as that shown in FIG. 6, is not expressly illustrated in a drawing here.

(Fourth Embodiment)

The unit of this embodiment is the same as those presented in the three preceding embodiments in terms of the anisotropic growth of crystal grains. The only difference is that the transistor of this embodiment is of the bottom gate type.

Figure 11:
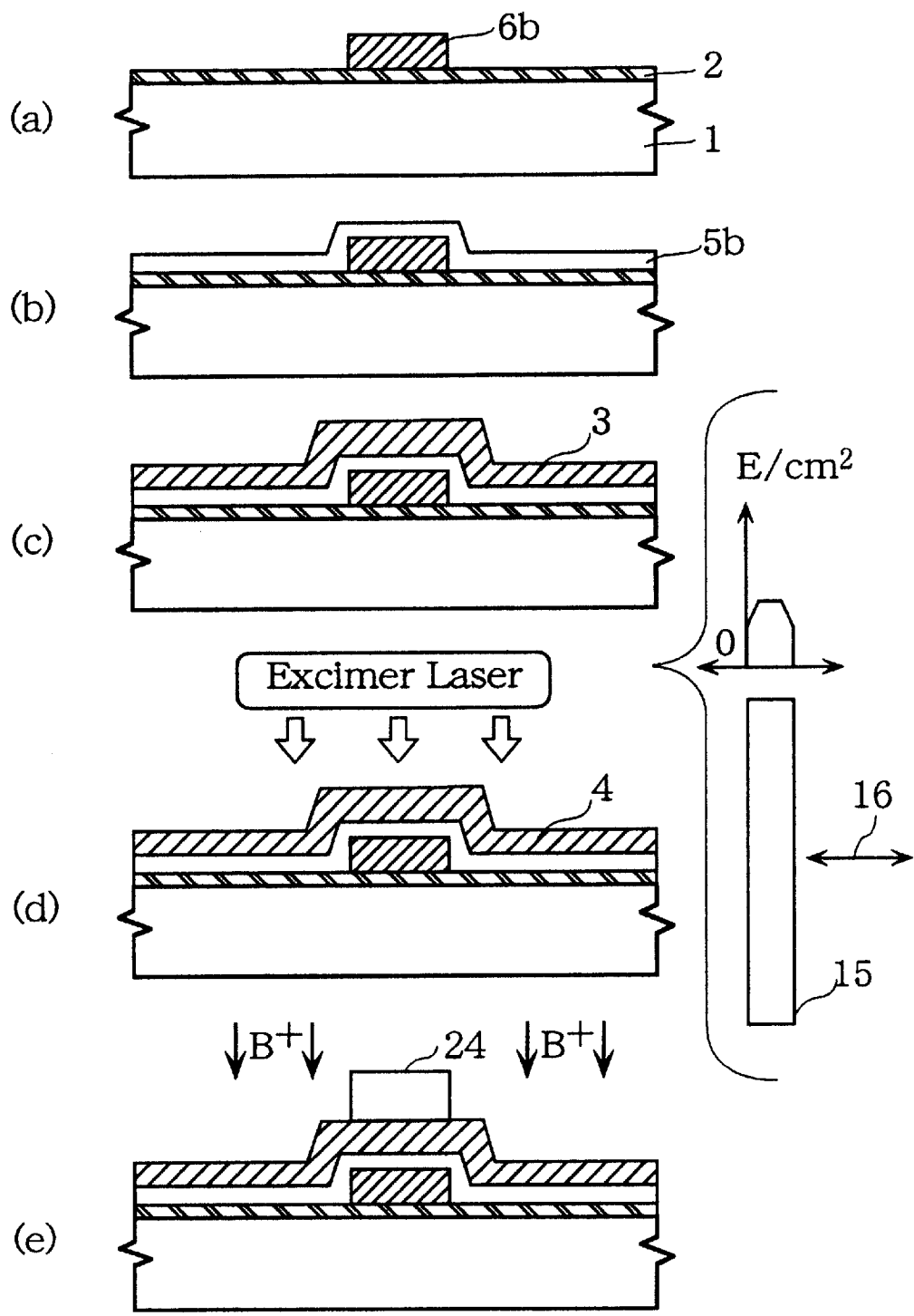
[FIG. 11] A conceptual view of the process of manufacture of a transistor and details of the laser beam in cases where the aforementioned first to the third embodiment is applied to a bottom gate type thin-film transistor (the fourth embodiment)

The manufacturing method of this embodiment will be described by referring to FIG. 11 as the following.

(a) Forming a gate electrode 6b at a prescribed position on a glass substrate 1 having a transparent undercoat insulating film 2 formed thereon;

(b) Forming a gate insulating film 5b comprising $SiO_2$ on the entire surface of the substrate;

(c) forming an amorphous silicon layer 3 on the entire surface of the substrate;

(d) Converting the amorphous silicon layer into a polycrystalline silicon layer 4 by irradiating an excimer laser; and (e) Patterning the polycrystalline silicon layer 4, and forming a thick resist pattern 24 on the upper portion of the gate electrode 5b; in this state, injecting ions of impurities such as P and B from the upper portion of the substrate.

Figure 2:
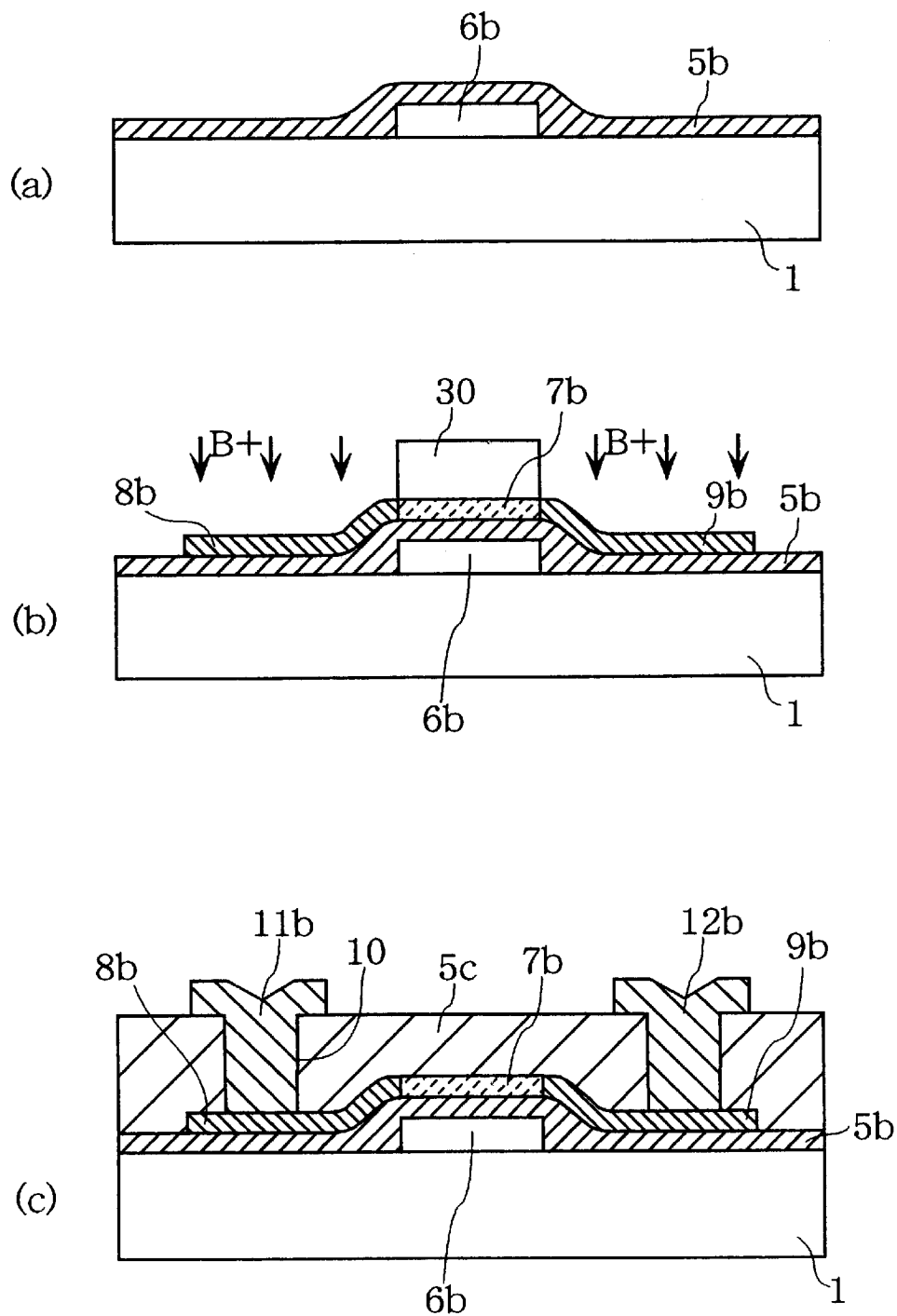
[FIG. 2] A conceptual view of the manufacturing method of a conventional bottom gate type thin-film transistor.

Subsequently, an interlayer insulating film is formed, and a contact hole is formed at a prescribed position of this interlayer insulating film. Then, this contact hole is filled with a metal to form a bottom gate type thin-film transistor as shown in FIG. 2(c).

Meantime, as to irradiation of the excimer laser as shown in FIG. 11(d), the beam 15 thereof has the same long and slender rectangular shape as in the embodiments described above as shown in FIG. 11(d) to the right, and the scanning direction 16 is at right angles to the longitudinal direction. However, the distribution of the energy density is different from that shown in FIG. 4(c): the curve is high at the center portion and low at both ends in the scanning direction and in the counter-scanning direction. Such an energy distribution is adopted because, while the beam must move sequentially on the entire surface of the substrate to scan the entire surface of the substrate, moving the beam in a direction perpendicular to the longitudinal direction causes the density spontaneously becomes higher at the center portion in the shorter side direction. (Note that in an actual manufacture, the substrate is moved relative to the fixed beam as described above.)

Unlike the top-gate type, the gate electrode section is necessary to make irradiation so as to avoid production of shade as a result thereof in the bottom gate type. In this embodiment as well, crystal grains become valid along the scanning direction of the beam. As the result, anisotropic growth of crystal grains in the same manner as in the preceding embodiments is accomplished, and hence a bottom-gate type thin-film semiconductor having the same features is available, depending upon whether the scanning direction is in the channel direction on the substrate, in a direction perpendicular thereto, or in a direction at an angle of 45°.

(Fifth Embodiment)

This embodiment relates to a combination of the gate length directions of the gate driving circuit section and the source driving circuit section, and laser annealing to cope therewith.

Figure 12:
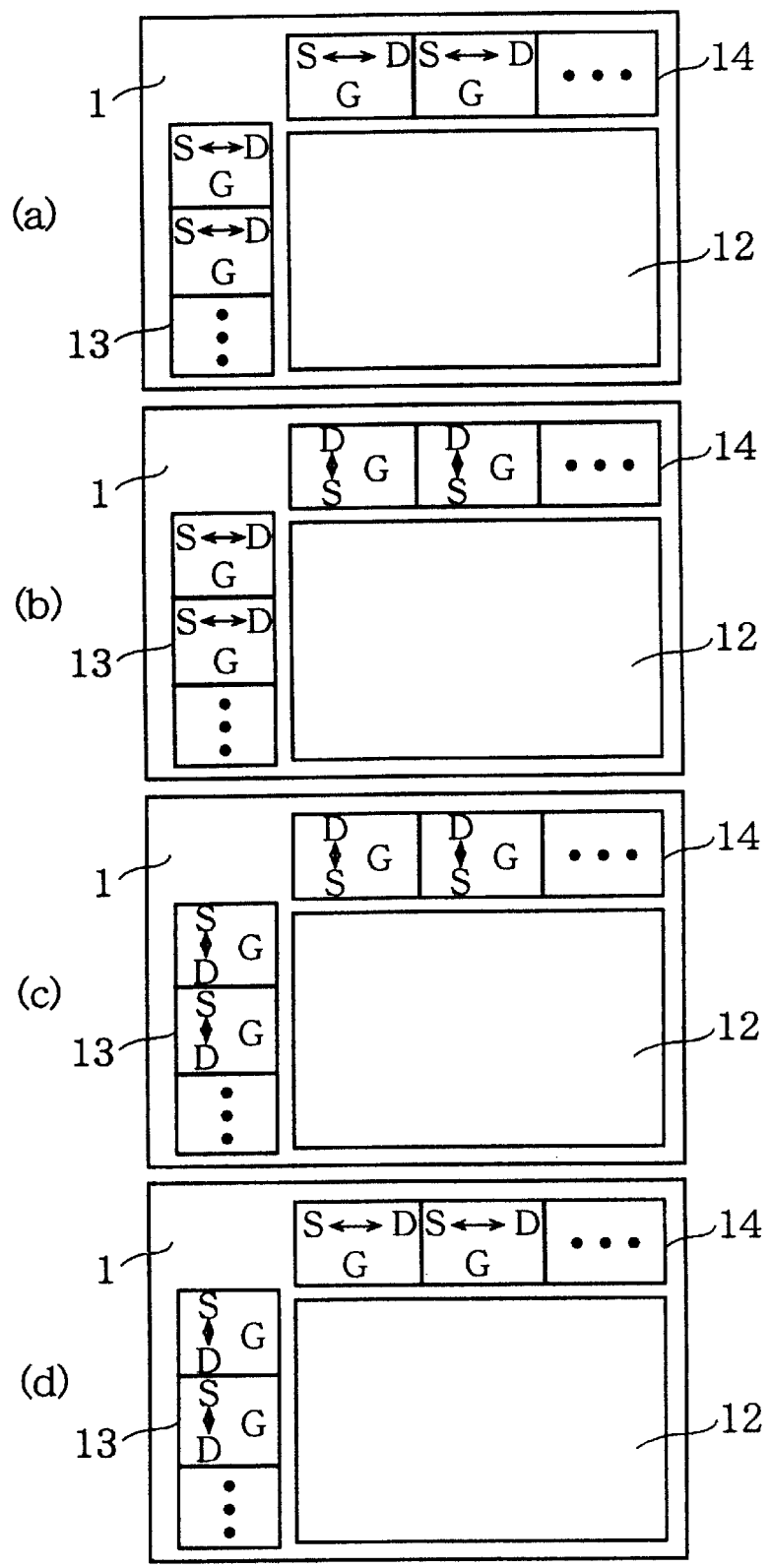
[FIG. 12] A view illustrating combinations of directions of the source electrode and the drain electrode of the gate driving circuit and the source driving circuit of the driving circuit section.

This embodiment will be described by referring to FIG. 12 as the following.

As shown in FIGS. 12(a) to 12(d), there are four combinations of the gate length directions which connect the source electrode and the drain electrode. In FIG. 12, 9 represents a source electrode of TFT; D, a drain electrode; G, a gate electrode; and the line having arrow at both ends between S and D represents the gate length direction. An appropriate combination is selected according to the use of the liquid crystal display unit.

Figure 13:
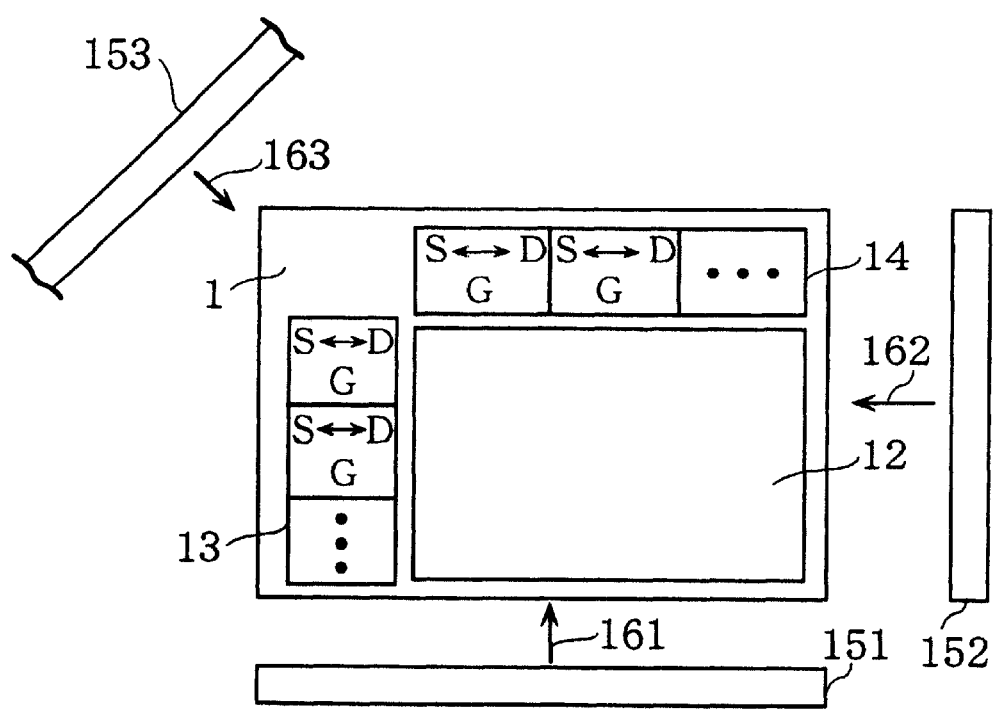
[FIG. 13] A view illustrating the relationship between the beam scanning direction and the angle formed between the substrate and the driving circuit.

Next, specifically taking the combination shown in FIG. 12(a) as an example, the beam scanning direction upon laser annealing may be any of the three combinations, as represented by arrows at both ends of 161, 162, and 163 shown in FIG. 13: the beams 161, 162, and 163 led in parallel with the individual gate driving circuit sections 13; in parallel with the source driving circuit sections 14; and movement in the longitudinal direction at an angle of 45° to the both circuit sections. As the result, the amorphous silicon thin film on the surface of the substrate is polycrystallized by a single run of laser beam scanning. Since a smaller amount of energy (E) per unit area suffices in this case for a thin-film transistor as compared with a thick-film transistor, it is needless to mention that no problem is encountered in the capacity of the laser source even with a wide substrate to be annealed.

(Sixth Embodiment)

This embodiment relates to a bottom-gate type thin-film transistor.

Figure 14:
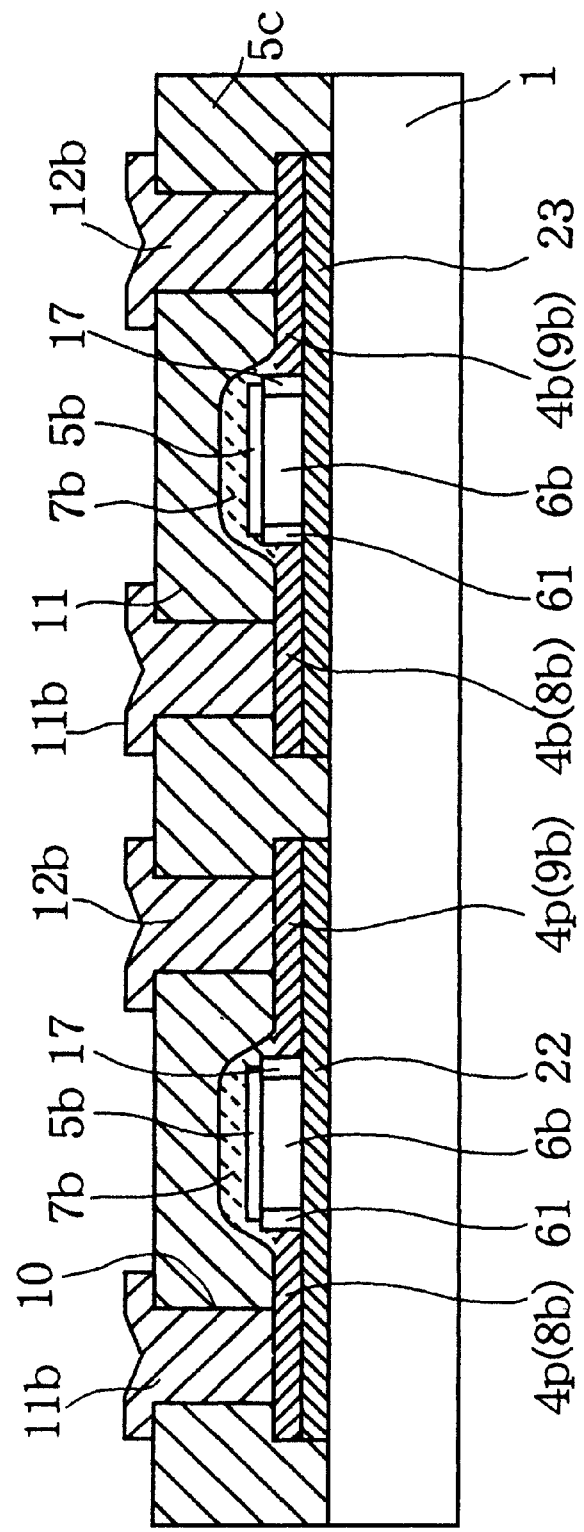
[FIG. 14] A conceptual view of the structure of a bottom gate type thin-film transistor in the sixth embodiment of the invention.

FIG. 14 illustrates the sectional structure of the thin-film transistor of this embodiment. In FIG. 14, 1 represents a glass transparent insulating substrate. On the substrate, the PSG layer 22 serving as an undercoat layer containing conductive impurities determining a conduction type of silicon, and the BSG layer 23 serving as an undercoat layer similarly containing another conductive impurities are selectively (at necessary portions in conformity to the layout of the elements) formed. The gate electrode 6b comprising a high-melting-point metal such as chromium, the first polysilicon layer 4p into which impurities are introduced by diffusion of P (phosphorus) from the PSG layer 22, and the second polysilicon layer 4b into which impurities are introduced by diffusion of B (boron) from the BSG layer 23, for example, are formed on the PSG layer 22 and the BSG layer 23. The first polysilicon layer 4p and the second polysilicon layer 4b constitute a source area 8b and a drain area 9b, respectively, of the thin-film transistor.

Further, the gate side wall insulating layers 61 for electrically insulating between the gate electrode and the first polysilicon layer into which impurities have been introduced, and between the gate electrode and the seconds plysilicon layer into which impurities have been introduced, are formed on the side of the gate electrode. The gate side wall insulating layer should preferably be an insulating layer obtained by oxidizing the gate electrode from the point of view of manufacture.

An insulating film 5b serving as a gate insulating layer is formed on the gate electrode 6b. A polysilicon layer into which impurities are not introduced is further formed thereon to serve as a channel area 7b of the thin-film transistor, so as to cover the gate insulating film 5b and the gate side wall insulating layer 61, and so as to come into contact with the first polysilcon layer 4p into which P has been introduced and the second polysilicon layer 4b into which B has been introduced.

In this element, an interlayer insulating layer 5c is, further, formed thereon, and the contact hole 10 is formed at a necessary position of this insulating layer. The source electrode 11b and the drain electrode 12b are formed by incorporating a metal into this contact hole 10.

Next, as is clear from the above description, this thin-film transistor uses heat diffusion of P and B from the undercoat layer containing the impurities determining the type of conduction such as the PSG layer and the BSG layer for forming the source area and the drain area. As the result, unlike the conventional one, the manufacturing method of this embodiment does not have a step of injecting impurity ions through acceleration under a high voltage into the polysilicon layers. Damages do not occur to the silicon semiconductor layer, caused by collision of ions accelerated under the high voltage. Because a photo-resist is not used as a mask for injection of impurities, no shift of alignment occurs, thus permitting forming the source area and the drain area at accurate positions.

The PSG layer and the BSG layer serving as undercoat film prevent alkali metals existing in the transparent insulating substrate which is a glass substrate from diffusing into the silicon semiconductor layer. Furthermore, as compared with the undercoat layer such as a silicon nitride film conventionally used for the purpose of preventing diffusion, the diffusion preventing effect of an alkali metal is higher. As the result, for example, during heat treatment in the latter stage of manufacture of the thin-film transistor, or more specifically, in the activation treatment after impurity ion injection, it is possible to prevent diffusion of alkali metals or the like exerting an adverse effect on the properties from diffusing from the glass substrate without fail.

It is needless to mention that the PSG layer or the BSG layer may be formed on the undercoat layer such as a silicon nitride film.

Next, the manufacturing method of the thin-film transistor of this embodiment will be described by referring to FIG. 15. FIG. 15 illustrates the progress of manufacture of the thin-film transistor along with development of the manufacturing steps.

(a) Forming the PSG film 22 containing about 3.5% P which is an N-type impurity as an undercoat insulating film in an area for forming a left-side N channel transistor; and forming the BSG film 23 containing about 35% B which is a P-type impurity as an undercoat insulating film in an area for forming a right-side P channel transistor.

Furthermore, the gate electrode material layer 6c comprising a Cr (chromium) film will be formed on these PSG film and the BSG film.

Subsequently, forming the gate insulating layer 5b such as $SiO_2$ on the entire surface, and for the purpose of forming a gate electrode pattern, the resist layer 24 will be formed only on the corresponding portion. That is to say, a resist pattern will be formed.

(b) Applying dry etching with the thus formed resist pattern 24 as a mask, the gate electrode 6b will be formed. In this case, a gate insulating layer will simultaneously be patterned.

(c) Removing the resist pattern used upon etching, the gate electrode side wall insulating layer 61 will be formed by oxidizing the gate electrode 6b by heating. This gate electrode side wall insulating layer 61 electrically insulates between a silicon, a silicon semiconductor layer formed thereafter and the gate electrode. In this embodiment, not only simple heating makes it easier to cause oxidation and form the gate electrode side wall insulating layer, but also passivation of the metal oxides causes stoppage of the oxidation when a certain oxide film pressure is reached, thus eliminating the risk of excessive oxidation even with an extra-fine particles. For these properties and heat resistance, Cr is used as a material.

(d) a semiconductor layer serving as a channel area, a source area or a drain area of the thin-film transistor will be formed. Specifically, an amorphous silicon film 3 is deposited on the entire surface of the substrate 1.

(e) Irradiating an excimer laser beam shown by an arrow onto the amorphous silicon layer 3 to accomplish polycrystallization thereof; the excimer laser irradiation area is thereby heated to a very high temperature, though instantaneously, but it is needless to mention that Cr having a high melting point used as a gate electrode material never melts.

Meatime, simultaneously with polycrystallization by means of the excimer laser beam, the source area and the drain area are subjected to an activation treatment through diffusion of impurities. More specifically, impurities P and B diffuse to the polycrystalline silicon layer from the PSG film and the BSG film at a high temperature resulting from irradiation of the excimer laser, thereby forming the source area and the drain area.

In this embodiment, as is clear from the above description, irradiation of the excimer laser permits simultaneous accomplishment of polycrystallization of the amorphous silicon layer and introduction of impurities into the source area and the drain area which are transistor elements. This eliminates the necessity of a step of accelerating and injecting impurities under a high voltage, and a step of bonding with a dangling bond (heat treatment), apart from polycrystallization. Since a mask used in the conventional art is not used at this point, the process is free from a shift between the mask and the gate electrode, thus permitting accurate formation of the source are and the drain area. The risk of damages to the semiconductor caused by collision of impurities or hydrogen ions accelerated under the high voltage during ion doping is also eliminated.

In FIG. 15(e), the thickness of the polycrystalline silicon layer present on the side of the gate electrode is larger than that of the polycrystalline silicon layers of the other areas. By properly controlling the heat treatment conditions or the like, therefore, the concentration of impurities P and B becomes lower toward the upper side of the substrate, thereby permitting automatic formation of an LDD structure.

(f) The interlayer insulating layer 5c comprising, for example, SiO$_2$, will be formed on the entire surface of the transparent insulating substrate having the gate electrode, the source area, and the drain area formed thereon.

(g) Forming the contact holes 10 at positions corresponding to the source area 8b and the drain area 9b of the interlayer insulating layer 5c, and incorporating a metal into the contact holes, the source electrode 11b and the drain electrode 12b will be formed, and thereby the thin-film transistor will be completed.

In this embodiment, the invention has been described as to a case where the silicon semiconductor layer composing the active layer of the thin-film transistor is a polycrystalline silicon layer. This layer is not, however, limited to a polycrystalline silicon layer, but may comprise amorphous silicon, silicon-germanium, or silicon-germanium-carbon.

Further, the gate insulating layer on the top of the gate electrode may be formed by oxidizing a gate electrode material such as Cr.

Similarly, the above description is based on a case where the N-channel transistor and the P-channel transistor are formed simultaneously on the substrate. However, only one of them may be formed.

The present invention has been described as above by means of a few embodiments, but it is needless to mention that the invention is not limited by these embodiments. For example, any of the following features may be adopted:

1) A crystallization accelerating agent such as trace Ti, Ni or Pd is added for reducing the temperature of polycrystallization of silicon (causing solid-phase growth);
2) Annealing is conducted by means other than laser such as electron beam for heating to polycrystallize silicon or to diffuse impurities;

Particularly, in the second group of aspects of the invention, heating is performed by means of an electric heater, or through simultaneous use of an electric heater;

3) The driving circuit section of the liquid crystal display unit is not limited to a one-sided mounting, but may be formed on each of all the frames including the upper, lower, right, and left frames;
4) Combining the fifth embodiment and the sixth embodiment; that is to say, the impurities are diffused from the undercoat layer, and at the same time with this, the longitudinal growth direction of the semiconductor grains forms a prescribed angle to the gate length direction;
5) The liquid crystal display unit is of the other type including the reflection type.

INDUSTRIAL APPLICABILITY

According to the present invention, as described above, it is possible to manufacture a high-performance TFT array having features such as a high electric field effect mobility of each TFT and uniform properties of TFTs by forming a polycrystalline semiconductor thin film obtained through excimer laser annealing of a silicon thin film to comprise long and slender fine grains, and providing a prescribed angle between the grain longitudinal direction and the gate length direction of the manufactured TFT. As the result, when using a liquid crystal display unit having a large screen, it is possible to obtain a TFT sufficiently satisfying property requirements taking account of the use of the unit.

Further, in a bottom-gate type semiconductor, since the impurities are soaked from the undercoat layer by heat diffusing, it is not necessary to provide an injector for injecting impurity ions under a high voltage and a heat treatment step to be required along with this, and in addition, damages to the silicon semiconductor layer caused by collision of the ions accelerated under a high voltage can be eliminated. It will also become possible to form the source area and the drain area accurately at the positions corresponding to the gate electrodes.

Further, an inexpensive glass substrate is used as a transparent insulating substrate. By using a PSG layer and a BSG layer as undercoat layers containing impurities, it is possible to prevent alkali metals and the like affecting properties of the thin-film transistor from diffusing from the glass substrate to the silicon semiconductor layer without fail.

Therefore, it is possible to provide a TFT excellent in its reliability and properties.

What is claimed is:

1. A thin-film transistor (TFT) comprising, as an active area, a polycrystalline semiconductor thin film formed by crystallizing an amorphous semiconductor material deposited on a substrate with laser annealing technique which conducts scanning in a direction at right angle to the longitudinal direction with a beam having a strip or rectangular shape, and having an energy density distribution in a shorter side direction, and uniform in the longitudinal direction; wherein:

the crystal grains of said semiconductor thin film have been anisotropically grown into a long ellipsoid having a longer diameter of from 3 to 5 microns and a shorter diameter of from 0.5 to 2 microns, of which the longitudinal growth direction forms a certain angle relative to the gate length direction connecting a source electrode and a drain electrode of each TFT in the substrate plane.

2. A thin-film transistor according to the claim 1, wherein the longitudinal direction of the crystal grains of said polycrystalline silicon thin film is in parallel with the gate length direction of the thin-film transistor.

3. A thin-film transistor according to the claim 2, wherein said polycrystalline semiconductor thin film contains from 0.5 to 2 crystal grains per micron gate length.

4. A thin-film transistor according to the claim 1, wherein, in said polycrystalline semiconductor thin film, the longitudinal growth direction length of the crystal grain is longer than the gate length.

5. A thin-film transistor according to claim 1, wherein said polycrystalline semiconductor thin film comprises silicon, silicon-germanium, or silicon-germanium-carbon.

6. A thin-film transistor according to the claim 4, wherein said polycrystalline semiconductor thin film comprises silicon, silicon-germanium, or silicon-germanium-carbon.

7. A thin-film transistor according to claim 1, wherein the longitudinal growth direction of the crystal grains of said polycrystalline silicon thin film forms right angle to the gate longitudinal direction of the thin-film transistor.

8. A thin-film transistor according to the claim 7, wherein said polycrystalline semiconductor thin film contains from 5 to 20 crystal grains per micron of the gate length.

9. A thin-film transistor according to the claim 7, wherein said polycrystalline semiconductor thin film comprises silicon, silicon-germanium, or silicon-germanium-carbon.

10. A thin-film transistor according to the claim 1, wherein the longitudinal direction of the crystal grains of said polycrystalline silicon thin film is inclined by 45° in the gate length direction of the thin-film transistor.

11. A thin-film transistor according to the claim 10, wherein said polycrystalline semiconductor thin film contains from 1 to 10 crystal grains per micron of the gate length.

12. A thin-film transistor according to the claim 10, wherein said polycrystalline semiconductor thin film comprises silicon, silicon-germanium, or silicon-germanium-carbon.

13. A thin-film transistor (TFT) which is a thin-film transistor of at least any one of the pixel section and the peripheral driving circuit section of a liquid crystal display unit having, as an active area, a polycrystalline semiconductor thin film formed by crystallizing an amorphous semiconductor material deposited on a substrate by a laser annealing technique which conducts scanning in a direction at right angle to the longitudinal direction with a beam having a strip or rectangular shape, and having an energy density distribution in a shorter side direction, and uniform in the longitudinal direction, wherein:

the crystal grains of said semiconductor thin film have been anisotropically grown into a long ellipsoid having a longer diameter of from 3 to 5 microns and a shorter diameter of from 0.5 to 2 microns, of which the longitudinal growth direction forms a certain angle relative to the gate length direction connecting a source electrode and a drain electrode of each TFT in the substrate plane.

14. A thin-film transistor according to the claim 13, wherein the longitudinal direction of the crystal grains of said polycrystalline silicon thin film is in parallel with the gate length direction of the thin-film transistor.

15. A thin-film transistor according to the claim 14, wherein said polycrystalline semiconductor thin film contains from 0.5 to 2 crystal grains per micron of the gate length.

16. A thin-film transistor according to the claim 13, wherein, in said polycrystalline semiconductor thin film, the longitudinal growth direction length of the crystal grain is longer than the gate length.

17. A thin-film transistor according to any claim 13, wherein said polycrystalline semiconductor thin film comprises silicon, silicon-germanium, or silicon-germanium-carbon.

18. A thin-film transistor according to the claim 16, wherein said polycrystalline semiconductor thin film comprises silicon, silicon-germanium, or silicon-germanium-carbon.

19. A thin-film transistor according to the claim 13, wherein the longitudinal growth direction of the crystal grains of said polycrystalline silicon thin film forms right angle to the gate longitudinal direction of the thin-film transistor.

20. A thin-film transistor according to the claim 19, wherein said polycrystalline semiconductor thin film contains from 5 to 20 crystal grains per micron of the gate length.

21. A thin-film transistor according to the claim 19, wherein said polycrystalline semiconductor thin film comprises silicon, silicon-germanium, or silicon-germanium-carbon.

22. A thin-film transistor according to the claim 13, wherein the longitudinal direction of the crystal grains of said polycrystalline silicon thin film is inclined by 45° in the gate length direction of the thin-film transistor.

23. A thin-film transistor according to the claim 22, wherein said polycrystalline semiconductor thin film contains from 1 to 10 crystal grains per micron of the gate length.

24. A thin film transistor according to the claim 22, wherein said polycrystalline semiconductor thin film comprises silicon, silicon-germanium, or silicon-germanium-carbon.

25. A thin-film transistor according to the claim 14 or 15, wherein said liquid crystal display unit is a liquid crystal display unit for a television set or for an animation display unit.

26. A thin-film transistor according to the claim 16, wherein said liquid crystal display unit is a liquid crystal display unit for a television set or for an animation display unit.

27. A thin-film transistor according to the claim 17, wherein said liquid crystal display unit is a liquid crystal display unit for a television set or for an animation display unit.

28. A thin-film transistor according to the claim 18, wherein said liquid crystal display unit is a liquid crystal display unit for a television set or for an animation display unit.

29. A thin-film transistor according to the claim 19 or 20, wherein said liquid crystal display unit is a liquid crystal display unit for a word processor, or for the display of a static image, or for the guidance in an electric train, or the like.

30. A thin-film transistor according to the claim 21, wherein said liquid crystal display unit is a liquid crystal display unit for a word processor, or for the display of a static image, or for the guidance in an electric car, or the like.

31. A thin-film transistor according to the claim 22 or 23, wherein said liquid crystal display unit is a liquid crystal display unit for a word processor, or for the display for a static image, or for the guidance in an electric car, or the like.

32. A thin-film transistor according to the claim 24, wherein said liquid crystal display unit is a liquid crystal display unit for a word processor.

* * * * *

UNITED STATES PATENT AND TRADEMARK OFFICE
CERTIFICATE OF CORRECTION

PATENT NO. : 6,479,837 B1  
DATED : November 12, 2002  
INVENTOR(S) : Kazufumi Ogawa and Kazuyasu Adachi It is certified that error appears in the above-identified patent and that said Letters Patent is hereby corrected as shown below:

<u>Title page,</u>  
Item [30], Foreign Application Priority Data, change "Feb. 4, 1999" to -- February 24, 1999 -- (second entry in paragraph).

Item [56], after FOREIGN PATENT DOCUMENTS and listed patents, insert

-- OTHER PUBLICATIONS  
Excimer-Laser-Induced Lateral-Growth of Silicon Thin-Films", 1997, pages 64-66. --

<u>Column 19,</u>  
Line 60, delete "any".

<u>Column 20,</u>  
Line 30, delete "or 15".  
Line 46, delete "or 20".  
Line 55, delete "or 23".

Signed and Sealed this

Twenty-seventh Day of May, 2003

JAMES E. ROGAN  
*Director of the United States Patent and Trademark Office*

UNITED STATES PATENT AND TRADEMARK OFFICE
CERTIFICATE OF CORRECTION

PATENT NO.   : 6,479,837 B1
DATED        : November 12, 2002
INVENTOR(S)  : Kazufumi Ogawa and Kazuyasu Adachi It is certified that error appears in the above-identified patent and that said Letters Patent is hereby corrected as shown below:

<u>Title page,</u>
Item [56], OTHER PUBLICATIONS, change "pages 64-66." to -- pages 63-66. --

Signed and Sealed this

Twenty-third Day of September, 2003

JAMES E. ROGAN
*Director of the United States Patent and Trademark Office*